United States Patent
Hussell et al.

(10) Patent No.: US 9,780,268 B2
(45) Date of Patent: Oct. 3, 2017

(54) SUBMOUNT BASED SURFACE MOUNT DEVICE (SMD) LIGHT EMITTER COMPONENTS AND METHODS

(71) Applicant: CREE, Inc., Durham, NC (US)

(72) Inventors: Christopher P. Hussell, Cary, NC (US); Erin Welch, Chapel Hill, NC (US); Jesse Colin Reiherzer, Wake Forest, NC (US); Peter Scott Andrews, Durham, NC (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 13/755,993

(22) Filed: Jan. 31, 2013

(65) Prior Publication Data

US 2013/0193468 A1 Aug. 1, 2013

Related U.S. Application Data

(63) Continuation-in-part of application No. 11/398,214, filed on Apr. 4, 2006, now Pat. No. 8,969,908.
(Continued)

(51) Int. Cl.
*H01L 33/54* (2010.01)
*H01L 33/48* (2010.01)
*H01L 33/62* (2010.01)

(52) U.S. Cl.
CPC ............ *H01L 33/54* (2013.01); *H01L 33/486* (2013.01); *H01L 33/62* (2013.01);
(Continued)

(58) Field of Classification Search
CPC ....... H01L 33/486; H01L 33/62; H01L 33/54; H01L 33/58
See application file for complete search history.

(56) References Cited

U.S. PATENT DOCUMENTS 4,946,547 A 8/1990 Palmour
5,200,022 A 4/1993 Kong
(Continued)

FOREIGN PATENT DOCUMENTS

CN 1815766 8/2006
CN 1947266 A 4/2007
(Continued)

OTHER PUBLICATIONS

U.S. Appl. No. 13/607,217 dated Sep. 7, 2012.
(Continued)

*Primary Examiner* — Benjamin Sandvik
(74) *Attorney, Agent, or Firm* — Jenkins, Wilson, Taylor & Hunt, P.A.

(57) ABSTRACT

Submount based surface mount design (SMD) light emitter components and related methods are disclosed. In some aspects, light emitter components can include a submount with a first side having a first surface area, first and second electrical contacts disposed on the first side of the submount, and at least one light emitter chip on the first side. In some aspects, the electrical contact area can be less than half of the first surface area of the first side of the submount. Components disclosed herein can include low profile parts or domes where a ratio between a dome height and a dome width is less than 0.5. A method of providing components can include providing a panel of material and LED chips, dispensing a liquid encapsulant material over the panel, and singulating the panel into individual submount based components after the encapsulant material has hardened.

59 Claims, 6 Drawing Sheets

Related U.S. Application Data

(60) Provisional application No. 61/618,327, filed on Mar. 30, 2012, provisional application No. 61/642,995, filed on May 4, 2012.

(52) U.S. Cl.
CPC ........... *H01L 2224/48091* (2013.01); *H01L 2224/48137* (2013.01); *H01L 2224/48227* (2013.01)

(56) References Cited

U.S. PATENT DOCUMENTS

| | | | |
|---|---|---|---|
| RE34,861 E | 2/1995 | Davis | |
| 6,503,780 B1 | 1/2003 | Glenn et al. | |
| 6,638,780 B2 | 10/2003 | Fukasawa et al. | |
| 6,686,609 B1 | 2/2004 | Sung | |
| 6,936,855 B1 | 8/2005 | Harrah | |
| 6,953,255 B2* | 10/2005 | Horiuchi et al. | 362/611 |
| D511,328 S | 11/2005 | Wang | |
| 7,066,626 B2 | 6/2006 | Omata | |
| 7,213,940 B1 | 5/2007 | Van De Ven | |
| D572,210 S | 7/2008 | Lee | |
| 7,521,728 B2 | 4/2009 | Andrews | |
| D615,504 S | 5/2010 | Keller et al. | |
| D615,505 S | 5/2010 | Butterworth et al. | |
| 7,791,061 B2 | 9/2010 | Edmond | |
| D628,966 S | 12/2010 | Kuwaharada et al. | |
| D631,020 S | 1/2011 | Chuang et al. | |
| D633,631 S | 3/2011 | Shieh et al. | |
| D637,565 S | 5/2011 | Wu et al. | |
| D642,143 S | 7/2011 | Kuwaharada et al. | |
| 7,982,709 B2 | 7/2011 | Sekiguchi et al. | |
| D645,416 S | 9/2011 | Kuwaharada et al. | |
| 8,058,088 B2 | 11/2011 | Cannon | |
| D649,943 S | 12/2011 | Kuwaharada et al. | |
| D649,944 S | 12/2011 | Kuwaharada et al. | |
| D656,906 S | 4/2012 | Leung | |
| D660,813 S | 5/2012 | Otaki et al. | |
| 8,202,745 B2 | 6/2012 | Andrews | |
| D662,902 S | 7/2012 | Shieh et al. | |
| D667,802 S | 9/2012 | Otaki et al. | |
| 8,267,550 B2 | 9/2012 | Wang | |
| D670,010 S | 10/2012 | Lin | |
| D680,504 S | 4/2013 | Noichi | |
| 8,536,787 B2* | 9/2013 | Motoya | C03C 3/066 313/512 |
| 8,563,339 B2 | 10/2013 | Tarsa | |
| D698,323 S | 1/2014 | Noichi | |
| D698,741 S | 2/2014 | Kobayashi et al. | |
| 8,669,573 B2 | 3/2014 | Medendorp, Jr. | |
| 8,680,546 B2 | 3/2014 | Konishi et al. | |
| 8,748,915 B2 | 6/2014 | Chan et al. | |
| D710,810 S | 8/2014 | Noichi | |
| D711,840 S | 8/2014 | Lowes et al. | |
| D718,258 S | 11/2014 | Lowes et al. | |
| D718,725 S | 12/2014 | Reiherzer et al. | |
| 8,969,908 B2 | 3/2015 | Negley et al. | |
| D738,832 S | 9/2015 | Hussell et al. | |
| 9,496,466 B2* | 11/2016 | Hussell | H01L 33/54 |
| 9,502,624 B2 | 11/2016 | Kuramoto et al. | |
| 2003/0067761 A1* | 4/2003 | Horiuchi et al. | 362/31 |
| 2004/0056265 A1 | 3/2004 | Arndt et al. | |
| 2004/0069993 A1 | 4/2004 | Murano | |
| 2005/0093005 A1 | 5/2005 | Ruhnau | |
| 2005/0184387 A1* | 8/2005 | Collins et al. | 257/712 |
| 2005/0219835 A1* | 10/2005 | Nagayama | 362/84 |
| 2005/0221519 A1* | 10/2005 | Leung et al. | 438/27 |
| 2006/0012299 A1* | 1/2006 | Suehiro et al. | 313/512 |
| 2006/0113906 A1* | 6/2006 | Ogawa | 313/512 |
| 2006/0145172 A1 | 7/2006 | Su et al. | |
| 2006/0157722 A1 | 7/2006 | Takezawa et al. | |
| 2006/0220046 A1 | 10/2006 | Yu et al. | |
| 2007/0161211 A1 | 7/2007 | Sunohara et al. | |
| 2007/0228387 A1 | 10/2007 | Negley | |
| 2008/0012036 A1 | 1/2008 | Loh | |
| 2008/0036362 A1* | 2/2008 | Tanimoto et al. | 313/498 |
| 2008/0106185 A1 | 5/2008 | Yamakawa | |
| 2008/0173884 A1 | 7/2008 | Chitnis | |
| 2008/0179611 A1 | 7/2008 | Chitnis | |
| 2008/0203417 A1 | 8/2008 | Konishi et al. | |
| 2008/0920347 | 8/2008 | Konishi et al. | |
| 2008/0224608 A1* | 9/2008 | Konishi et al. | 313/505 |
| 2009/0057690 A1 | 3/2009 | Chakraborty | |
| 2009/0057699 A1* | 3/2009 | Basin et al. | 257/98 |
| 2009/0057901 A1 | 3/2009 | Lin et al. | |
| 2009/0108281 A1 | 4/2009 | Keller | |
| 2009/0115313 A1 | 5/2009 | Lu et al. | |
| 2009/0140271 A1* | 6/2009 | Sah | F21K 9/00 257/88 |
| 2009/0146176 A1 | 6/2009 | Oishi | |
| 2009/0166657 A1 | 7/2009 | Yamada et al. | |
| 2009/0315057 A1* | 12/2009 | Konishi et al. | 257/98 |
| 2009/0322197 A1 | 12/2009 | Helbing | |
| 2010/0022040 A1* | 1/2010 | Konishi | B29C 45/14655 438/29 |
| 2010/0155763 A1 | 6/2010 | Donofrio | |
| 2010/0165246 A1* | 7/2010 | Sekiguchi | G02F 1/133603 349/62 |
| 2010/0212942 A1* | 8/2010 | Tuan et al. | 174/257 |
| 2010/0237375 A1 | 9/2010 | Yamazaki et al. | |
| 2010/0252851 A1 | 10/2010 | Emerson | |
| 2010/0258830 A1 | 10/2010 | Ide et al. | |
| 2010/0259706 A1* | 10/2010 | Kuwaharada | F21V 5/04 349/62 |
| 2010/0301367 A1* | 12/2010 | Nakamura et al. | 257/98 |
| 2011/0001156 A1* | 1/2011 | Matsuda | H01L 25/167 257/98 |
| 2011/0006334 A1 | 1/2011 | Ishii | |
| 2011/0018017 A1 | 1/2011 | Bierhuizen et al. | |
| 2011/0031524 A1 | 2/2011 | Pei | |
| 2011/0062471 A1 | 3/2011 | Bierhuizen et al. | |
| 2011/0079801 A1* | 4/2011 | Zhang et al. | 257/98 |
| 2011/0089465 A1 | 4/2011 | Lin et al. | |
| 2011/0127903 A1* | 6/2011 | Yao | H01L 33/54 313/498 |
| 2011/0220929 A1 | 9/2011 | Collins et al. | |
| 2011/0273079 A1 | 11/2011 | Pickard et al. | |
| 2011/0309396 A1 | 12/2011 | Wang et al. | |
| 2011/0316024 A1 | 12/2011 | Hung | |
| 2012/0153340 A1 | 6/2012 | Song | |
| 2012/0299022 A1 | 11/2012 | Hussell | |
| 2012/0305949 A1 | 12/2012 | Donofrio | |
| 2012/0319150 A1 | 12/2012 | Shimomura | |
| 2013/0087822 A1 | 4/2013 | Kim | |
| 2013/0099265 A1 | 4/2013 | Hwang | |
| 2013/0256711 A1 | 10/2013 | Joo | |
| 2013/0270592 A1 | 10/2013 | Reiherzer | |
| 2013/0279169 A1 | 10/2013 | Reiherzer | |
| 2014/0291715 A1 | 10/2014 | Reiherzer et al. | |
| 2015/0280082 A1* | 10/2015 | Amo | H01L 33/483 257/98 |

FOREIGN PATENT DOCUMENTS

| | | |
|---|---|---|
| CN | 101026206 A | 8/2007 |
| CN | 101056960 A | 10/2007 |
| CN | 101614339 A | 12/2009 |
| CN | 101971378 A | 2/2011 |
| CN | 102280567 | 12/2011 |
| CN | ZL 201330359083.X | 5/2014 |
| JP | 2000-022218 | 1/2000 |
| JP | 2000-353826 A | 12/2000 |
| JP | 2001-160630 | 6/2001 |
| JP | 2001-237462 | 8/2001 |
| JP | 2006-093435 | 4/2006 |
| JP | 2007-189006 | 7/2007 |
| JP | 2009-146935 | 7/2009 |
| JP | D140389 | 5/2011 |
| KR | 10-0829910 | 5/2008 |
| KR | 10-0933920 | 12/2009 |
| KR | 10-2010-0008509 | 1/2010 |
| KR | 10-2011-0111941 | 10/2011 |

(56) References Cited

FOREIGN PATENT DOCUMENTS

| TW | D140389 | 5/2011 |
| TW | D162119 | 8/2014 |
| WO | WO 2013/148823 | 10/2013 |
| WO | WO 2013/148826 | 10/2013 |
| WO | WO 2014/120256 | 8/2014 |

OTHER PUBLICATIONS

International Search Report and Written Opinion for Application No. PCT/US2013/034084 dated Jul. 25, 2013.
International Search Report and Written Opinion for Application No. PCT/US2013/034087 dated Jul. 25, 2013.
International Search Report and Written Opinion for Application No. PCT/US2013/035411 dated Oct. 15, 2013.
Chinese Correction of Deficiencies for Application No. 201330359083.X dated Nov. 5, 2013.
Taiwanese Office Action and Search Report for Application No. 102302923 dated Dec. 30, 2013.
Chinese Notice of Grant for Application No. 201330359083.X dated Jan. 26, 2014.
Taiwanese Notice of Allowance for Application No. 102302923 dated Apr. 7, 2014.
Restriction Requirement for U.S. Appl. No. 13/800,284 dated Mar. 31, 2014.
Non-Final Office Action for U.S. Appl. No. 13/800,284 dated Jun. 30, 2014.
Restriction Requirement for U.S. Appl. No. 13/834,195 dated Jul. 21, 2014.
Final Office Action for U.S. Appl. No. 13/800,260 dated Jul. 23, 2015.
Non-Final Office Action for U.S. Appl. No. 13/834,195 dated Nov. 19, 2014.
Final Office Action for U.S. Appl. No. 13/800,284 dated Dec. 16, 2014.
Restriction Requirement for U.S. Appl. No. 29/444,591 dated Jan. 30, 2015.
Non-Final Office Action for U.S. Appl. No. 13/800,260 dated Feb. 5, 2015.
Machine translation of JP 200-022218 A published Jan. 21, 2000 Tadaaki.
Machine translation of KR 10-2009-0049979 published Dec. 28, 2009 Kim et al.
Final Office Action for U.S. Appl. No. 13/834,195 dated Mar. 6, 2015.
Advisory Action for U.S. Appl. No. 13/800,284 dated Mar. 13, 2015.
Interview Summary for U.S. Appl. No. 13/800,284 dated Mar. 19, 2015.
Notice of Allowance for U.S. Appl. No. 29/444,591 dated May 12, 2015.
Non-Final Office Action for U.S. Appl. No. 13/800,284 dated Jun. 4, 2015.
Chinese Office Action for Application No. 201380018673 dated Jun. 21, 2016.
Advisory Action for U.S. Appl. No. 13/800,260 dated Oct. 14, 2015.
Advisory Action for U.S. Appl. No. 13/800,284 dated Jan. 4, 2016.
Non-Final Office Action for U.S. Appl. No. 13/834,195 dated Feb. 26, 2016.
Non-Final Office Action for U.S. Appl. No. 13/800,284 dated May 19, 2016.
Non-Final Office Action for U.S. Appl. No. 13/800,260 dated Jun. 15, 2016.
Final Office Action for U.S. Appl. No. 13/834,195 dated Jun. 23, 2016.
Chinese Office Action for Application No. 2013800181871 dated Apr. 25, 2016.
Chinese Office Action for Application No. 2013800181871 dated Oct. 17, 2016.
Chinese Office Action for Application No. 201180065495 dated Nov. 4, 2016.
Final Office Action for U.S. Appl. No. 13/800,284 dated Nov. 22, 2016.
Non-Final Office Action for U.S. Appl. No. 13/834,195 dated Nov. 28, 2016.
Non-Final Office Action for U.S. Appl. No. 13/800,260 dated Jan. 3, 2017.
Chinese Office Action with English Summary for Chinese Application No. 201380071952 dated Nov. 2, 2016.
Japanese Decision of Grant for Japanese Patent Application No. 2013-540955 dated Jan. 10, 2017.
Chinese Office Action for Application No. 201180065495 dated Feb. 22, 2017.
Notice of Allowance for U.S. Appl. No. 13/834,195 dated Apr. 11, 2017.
Non-Final Office Action for U.S. Appl. No. 13/800,284 dated May 1, 2017.
Chinese Office Action for Application No. 2013800181871 dated Apr. 20, 2017.
Notice of Issuance for Chinese Application No. 201380071952.6 dated Jun. 2, 2017.
Non-Final Office Action for U.S. Appl. No. 13/800,260 dated Jul. 17, 2017.
Interview Summary for U.S. Appl. No. 13/800,284 dated Jul. 19, 2017.

\* cited by examiner

SUBMOUNT BASED SURFACE MOUNT DEVICE (SMD) LIGHT EMITTER COMPONENTS AND METHODS

CROSS REFERENCE TO RELATED APPLICATIONS

This application relates and claims priority to U.S. Provisional Patent Application Ser. Nos. 61/618,327, filed Mar. 30, 2012, and 61/642,995, filed May 4, 2012, which are incorporated by reference herein in their entireties.

TECHNICAL FIELD

The subject matter disclosed herein relates generally to surface mount device (SMD) components and methods. More particularly, the subject matter disclosed herein relates to submount based SMD light emitter components and methods.

BACKGROUND

Light emitting diodes (LEDs) or LED chips are solid state devices that convert electrical energy into light. LED chips can be utilized in light emitter components or packages for providing different colors and patterns of light useful in various lighting and optoelectronic applications. Light emitter components can include surface mount devices (SMDs) which can be mounted directly onto the surface of an underlying circuit component or heat sink, such as a printed circuit board (PCB) or metal core printed circuit board (MCPCB). SMDs can comprise bottom electrical contacts or leads configured to directly mount to the underlying circuit component. SMDs can be used in various LED light bulb and light fixture applications and are developing as replacements for incandescent, fluorescent, and metal halide high-intensity discharge (HID) lighting applications.

Manufacturers of LED lighting products are constantly seeking ways to reduce their cost in order to provide a lower initial cost to customers, and encourage the adoption of LED products. Components incorporating fewer raw materials at sustained or increased brightness levels using the same or less power are becoming more desirable.

Conventional SMD light emitter components can utilize one or more LED chips mounted within a component body and surrounded by a reflector cavity. The component body and integrally formed reflector cavity are molded from the same material, and portions of the body are typically molded about electrical contacts or leads. Individually molding component bodies and forming reflector cavities can be both expensive and time-consuming. To date, there are no SMDs currently built around an individual, submount or panel, but rather current products are typically individually molded.

Thus, despite the availability of various SMD light emitter components in the marketplace, a need remains for components and methods which can be produced quickly, efficiently, and at a lower cost. In some aspects, submount based SMD components can allow for customized components having different trace configurations, different LED chip connectivity, and/or different optical elements. Such components can be single or multi-chip components, and can make it easier for end-users to justify switching to LED products from a return on investment or payback perspective.

SUMMARY

In accordance with this disclosure, submount based surface mount device (SMD) light emitter components and methods having improved manufacturability and customization are provided and described herein. Components and methods described herein can advantageously exhibit improved processing times, ease of manufacture, and/or lower processing costs. Components described herein can be well suited for a variety of applications such as personal, industrial, and commercial lighting applications including, for example, light bulbs and light fixture products and/or applications. In some aspects, components described herein can comprise an improved, lower and/or smaller dome height to width ratio. This can provide components having excellent brightness at a low profile and a smaller footprint. It is, therefore, an object of the present disclosure to provide SMD light emitter components and methods that are submount based, in some aspects, by allowing a multitude of different components to be created over a panel, without incurring the expense of custom fabricated packages.

These and other objects of the present disclosure as can become apparent from the disclosure herein are achieved, at least in whole or in part, by the subject matter disclosed herein.

BRIEF DESCRIPTION OF THE DRAWINGS

A full and enabling disclosure of the present subject matter including the best mode thereof to one of ordinary skill in the art is set forth more particularly in the remainder of the specification, including reference to the accompanying figures, in which.

DETAILED DESCRIPTION

Figure 1A:
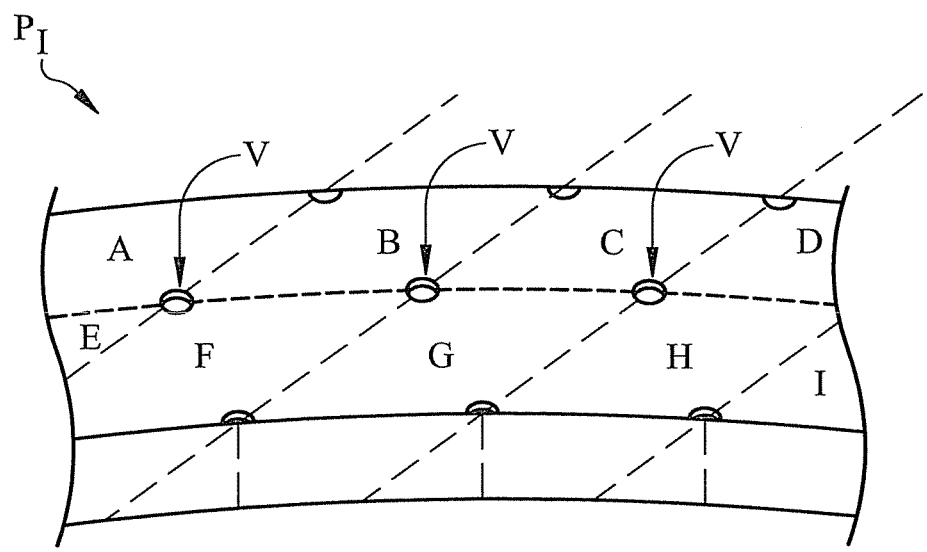
FIGS. 1A to 1C are perspective views illustrating a panel of submounts as used in light emitter components according to the disclosure herein.

The subject matter disclosed herein is directed to submount based surface mount design (SMD) light emitter components and methods, such as submount based light emitting diode (LED) components and methods. Components and methods provided herein can exhibit improved manufacturability as well as provide for customized components for supporting LED chips and allowing electrically connectivity thereof, without incurring the expense associated with custom fabricated ceramic or plastic packages.

Notably, individual submounts and/or submount based components can be singulated from a larger panel of material, for example, a ceramic substrate, and can allow a multitude of different components to be formed thereon. In some aspects, light emitter components and methods described herein do not require reflector cavities disposed about LED chips for reflecting light. In some aspects, light emitter components described herein can comprise non-metallic submount material(s) that is/are substantially reflective and substantially non-absorbing of light emitted by one or more LED chips. In some aspects, light emitter components described herein can comprise an optical element formed and held in place via surface tension.

In some aspects, light emitter components and methods provided herein can comprise low profile parts having less than approximately 2:1 ratio (e.g., a ratio of less than approximately 0.5) between a dome height and a dome width. In some aspects, light emitter components and methods provided herein can comprise low profile parts having less than a 0.4 ratio of a dome height to a dome width, less than a 0.3 ratio, or less than a 0.2 ratio of dome height to dome width. In some aspects, an optical element can be provided over the submount in liquid form and can be bounded via natural surface tension and obviate the need for a being bounded in a reflector cavity and/or being molded. In some aspects, the optical element can be inexpensively dispensed.

In other aspects, light emitter components and methods provided herein can comprise a meniscus forming feature. The meniscus forming feature can be disposed proximate edges of the front (top) side of the submount and can create a boundary for holding an optical element applied in liquid form, prior to curing or hardening. In some aspects, components and methods described herein can comprise an optical element having a novel low height to width ratio.

In some aspects, metallic traces or electrical contacts can be minimized in size over portions of the submount to reduce interference with light. In some aspects, metallic traces or electrical contacts can be spaced apart from one or more light emitter chips (e.g., LED chips) and can be disposed proximate the edges of the submount to reduce interference, absorption of, and/or potential blockage of light. In some aspects, a total amount of combined surface area for at least two metallic traces or electrical contacts can be less than approximately 50% of the overall surface area of the top surface of the submount, less than approximately 40% of the top surface area of the submount, less than approximate 30% of the top surface area of the submount, or less than approximately 20% of the top surface area of the submount.

In some aspects, an optical element can be provided over the submount in liquid form and can be bounded via natural surface tension and obviate the need for a being bounded in a reflector cavity and/or being molded. That is, in some aspects, the optical element can comprise encapsulant. The encapsulant can comprise a dome portion, and at least a portion of the encapsulant can be disposed on a same surface that the LED chip is mounted to and/or a same surface that the traces or electrical contacts are deposited to.

Reference will be made in detail to possible aspects or embodiments of the subject matter herein, one or more examples of which are shown in the figures. Each example is provided to explain the subject matter and not as a limitation. In fact, features illustrated or described as part of one embodiment can be used in another embodiment to yield still a further embodiment. It is intended that the subject matter disclosed and envisioned herein covers such modifications and variations.

As illustrated in the various figures, some sizes of structures or portions are exaggerated relative to other structures or portions for illustrative purposes and, thus, are provided to illustrate the general structures of the present subject matter. Furthermore, various aspects of the present subject matter are described with reference to a structure or a portion being formed on other structures, portions, or both. As will be appreciated by those of skill in the art, references to a structure being formed "on" or "above" another structure or portion contemplates that additional structure, portion, or both may intervene. References to a structure or a portion being formed "on" another structure or portion without an intervening structure or portion are described herein as being formed "directly on" the structure or portion. Similarly, it will be understood that when an element is referred to as being "connected", "attached", or "coupled" to another element, it can be directly connected, attached, or coupled to the other element, or intervening elements may be present. In contrast, when an element is referred to as being "directly connected", "directly attached", or "directly coupled" to another element, no intervening elements are present.

Furthermore, relative terms such as "on", "above", "upper", "top", "lower", or "bottom" are used herein to describe one structure's or portion's relationship to another structure or portion as illustrated in the figures. It will be understood that relative terms such as "on", "above", "upper", "top", "lower" or "bottom" are intended to encompass different orientations of the component in addition to the orientation depicted in the figures. For example, if the component in the figures is turned over, structure or portion described as "above" other structures or portions would now be oriented "below" the other structures or portions. Likewise, if components in the figures are rotated along an axis, structure or portion described as "above", other structures or portions would be oriented "next to" or "left of the other structures or portions. Like numbers refer to like elements throughout.

Unless the absence of one or more elements is specifically recited, the terms "comprising", including", and "having" as used herein should be interpreted as open-ended terms that do not preclude the presence of one or more elements.

As used herein, the terms "through-hole", "thru-hole", and/or "via" are synonymous and refer an opening in the submount, often filled and/or lined (e.g., along one or more side walls) with an electrically conductive material that allows for an electrically conductive conduit or pathway between different layers, surfaces, or features of the component. The term "exposing" a thru-hole or via refers to sawing, cutting, dicing, breaking, etching, uncovering, displacing, or otherwise causing the metal disposed inside the via to be exposed on an external surface of the submount. Thus, the conductive material will be "exposed" outside of and/or along an exterior, outer surface of the component, or component submount.

As used herein a "ceramic based material" or the term "ceramic based" includes a material that consists primarily of a ceramic material, such as an inorganic, non-metallic material made from compounds of a metal or metalloid and a non-metal (e.g., aluminum nitride, aluminum oxide, beryllium oxide, silicon carbide). A "non-ceramic based material" consists primarily a metallic material, a primarily organic (e.g., polymeric) material, and/or a primarily synthetic or semi-synthetic organic solid that can be dispensed or molded (e.g., plastic).

Light emitter components according to embodiments described herein can comprise group III-V nitride (e.g., gallium nitride (GaN)) based LED chips or lasers. Fabrication of LED chips and lasers is generally known and only briefly described herein. LED chips or lasers can be fabricated on a growth substrate, for example, a silicon carbide (SiC) substrate, such as those devices manufactured and sold by Cree, Inc. of Durham, N.C. Other growth substrates are also contemplated herein, for example and not limited to sapphire, silicon (Si), and GaN. In some aspects, SiC substrates/layers can be 4H polytype silicon carbide substrates/layers. Other SiC candidate polytypes, such as 3C, 6H, and 15R polytypes, however, can be used. Appropriate SiC substrates are available from Cree, Inc., of Durham, N.C., the assignee of the present subject matter, and the methods for producing such substrates are set forth in the scientific literature as well as in a number of commonly assigned U.S. patents, including but not limited to U.S. Pat. No. Re. 34,861; U.S. Pat. No. 4,946,547; and U.S. Pat. No. 5,200,022, the disclosures of which are incorporated by reference herein in their entireties. Any other suitable growth substrates are contemplated herein.

As used herein, the term "Group III nitride" refers to those semiconducting compounds formed between nitrogen and one or more elements in Group III of the periodic table, usually aluminum (Al), gallium (Ga), and indium (In). The term also refers to binary, ternary, and quaternary compounds such as GaN, AlGaN and AlInGaN. The Group III elements can combine with nitrogen to form binary (e.g., GaN), ternary (e.g., AlGaN), and quaternary (e.g., AlInGaN) compounds. These compounds may have empirical formulas in which one mole of nitrogen is combined with a total of one mole of the Group III elements. Accordingly, formulas such as $Al_xGa1-xN$ where $1>x>0$ are often used to describe these compounds. Techniques for epitaxial growth of Group III nitrides have become reasonably well developed and reported in the appropriate scientific literature.

Although various embodiments of LED chips disclosed herein can comprise a growth substrate, it will be understood by those skilled in the art that the crystalline epitaxial growth substrate on which the epitaxial layers comprising an LED chip are grown can be removed, and the freestanding epitaxial layers can be mounted on a substitute carrier substrate or substrate which can have different thermal, electrical, structural and/or optical characteristics than the original substrate. The subject matter described herein is not limited to structures having crystalline epitaxial growth substrates and can be used in connection with structures in which the epitaxial layers have been removed from their original growth substrates and bonded to substitute carrier substrates.

Group III nitride based LED chips according to some embodiments of the present subject matter, for example, can be fabricated on growth substrates (e.g., Si, SIC, or sapphire substrates) to provide horizontal devices (with at least two electrical contacts on a same side of the LED chip) or vertical devices (with electrical contacts on opposing sides of the LED chip). Moreover, the growth substrate can be maintained on the LED chip after fabrication or removed (e.g., by etching, grinding, polishing, etc.). The growth substrate can be removed, for example, to reduce a thickness of the resulting LED chip and/or to reduce a forward voltage through a vertical LED chip. A horizontal device (with or without the growth substrate), for example, can be flip chip bonded (e.g., using solder) to a carrier substrate or printed circuit board (PCB), or wirebonded. A vertical device (with or without the growth substrate) can have a first terminal (e.g., anode or cathode) solder bonded to a carrier substrate, mounting pad, or PCB and a second terminal (e.g., the opposing anode or cathode) wirebonded to the carrier substrate, electrical element, or PCB. Examples of vertical and horizontal LED chip structures are discussed by way of example in U.S. Publication No. 2008/0258130 to Bergmann et al. and in U.S. Pat. No. 7,791,061 to Edmond et al. which issued on Sep. 7, 2010, the disclosures of which are hereby incorporated by reference herein in their entireties.

One or more LED chips can be at least partially coated with one or more phosphors. The phosphors can absorb a portion of light from the LED chip and emit light at a different wavelength such that the light emitter component emits a combination of light from each of the LED chip and the phosphor. In one embodiment, the light emitter component emits what is perceived as white light resulting from a combination of light emission from the LED chip and the phosphor. In one embodiment according to the present subject matter, white emitting components can consist of an LED chip that emits light in the blue wavelength spectrum and a phosphor that absorbs some of the blue light and re-emits light in the green, yellow, and/or red wavelength spectrum. The components can therefore emit a white light combination across the visible spectrum of light. In other embodiments, the LED chips can emit a non-white light combination of blue and yellow light as described in U.S. Pat. No. 7,213,940. LED chips emitting red light or LED chips covered by a phosphor that absorbs LED light and emits a red light are also contemplated herein.

LED chips can be coated with a phosphor using many different methods, with one suitable method being described in U.S. patent application Ser. Nos. 11/656,759 and 11/899,790, both entitled "Wafer Level Phosphor Coating Method and Devices Fabricated Utilizing Method", and both of which are incorporated herein by reference in their entireties. Other suitable methods for coating one or more LED chips are described in U.S. Pat. No. 8,058,088 entitled "Phosphor Coating Systems and Methods for Light Emitting Structures and Packaged Light Emitting Diodes Including Phosphor Coating" which issued on Nov. 15, 2011, and the continuation-in-part application U.S. patent application Ser. No. 12/717,048 entitled "Systems and Methods for Application of Optical Materials to Optical Elements", the disclosures of which are hereby incorporated by reference herein in their entireties. LED chips can also be coated using other methods such as electrophoretic deposition (EPD), with a suitable EPD method described in U.S. patent application Ser. No. 11/473,089 entitled "Close Loop Electrophoretic Deposition of Semiconductor Devices", which is also incorporated herein by reference in its entirety. It is understood that light emitter components and methods according to the present subject matter can also have multiple LED chips of different colors, one or more of which can be white emitting.

FIGS. 1A through 10 illustrate embodiments of submount based SMD light emitter components and related methods according to the present subject matter as disclosed and described herein. FIGS. 1A to 1C are portions of substrates or panels, generally designated $P_I$, $P_{II}$, and $P_{III}$, respectively, from which one or more individual submounts denoted by letters A to S, can be singulated, separated, and/or physically isolated. In some aspects panels $P_I$, $P_{II}$, and $P_{III}$, can extend further in length and/or width than shown, but for illustration purposes only portions thereof may be illustrated. In some aspects, submounts A to S, can be provided with light emitters, such as LED chips, traces, and/or an optical element prior to singulation into individual submounts A to S. In other aspects, submounts A to S, can be singulated or separated from respective panels prior to any processing step including prior to forming traces or electrical contacts, prior to die attach, prior to wirebonding, and/or prior to encapsulation.

In some aspects, panels $P_I$, $P_{II}$, and $P_{III}$ can each comprise a non-metallic material, such as a transparent ceramic based material for maximizing light extraction and reflectance. For example, panels $P_I$, $P_{II}$, and $P_{III}$ can comprise a substrate of aluminum oxide (e.g., alumina or $Al_2O_3$) or a substrate containing $Al_2O_3$. The broken lines along panels $P_I$, $P_{II}$, and $P_{III}$ indicate lines along which the panels may be scribed, sawn, cut, etched, and/or otherwise physically separated, for providing or forming individual submounts A to S. Individual submounts A to S, can comprise at least one substantially flat upper surface over which one or more LED chips (14, FIG. 2) can be mounted. Notably, components described herein can provide customized packages that are submount based and can be provided at improved costs and/or at improved physical dimensions.

Individual submounts A to S, can comprise any size, shape, and/or cross-sectional shape. For illustration purposes, individual submounts A to S having a substantially square or rectangular cross-sectional shape are shown, however, any other non-rectangular shape is contemplated herein. Notably, individual submounts A to S, can comprise the building blocks of customized SMD type emitter components or packages described herein. For example, in some aspects, single or multi-chip components can be provided, components having any size, shape, and/or pattern of traces can be provided, and components having the same or differently colored LED chips can be provided over and/or around portions of the individual submounts A to S. Notably, customized packages do not require formation of a cavity about the LED chips, which can advantageously reduce both manufacturing costs and materials cost associated with providing components and packages descried herein. Notably, a multitude of different customized components can be provided without the expense of creating custom fabricated ceramic components and/or custom molded plastic components.

Panels $P_I$, $P_{II}$, and $P_{III}$ can optionally comprise one or more openings, thru-holes or vias, generally designated V. For illustration purposes, substantially circular shaped vias V are illustrated, however, any size, shape, and/or cross-sectional shape of vias V can be provided. An electrically conductive material, such as a metal or metal alloy, can be provided inside portions of vias V for creating electrically conductive vias. In some aspects, vias V can be filled with a metal and/or a conductive material such as silver (Ag), copper (Cu), gold (Au), tin (Sn) and/or Ag, Cu, Au, or Sn alloys for electrically connecting a top electrical contact with a bottom electrical contact (see, e.g., FIG. 5) of an SMD type component. In other aspects, conductive material disposed within vias V can be exposed to form novel electrical contacts disposed on three surfaces of the component (see, e.g., 108 FIG. 9).

FIG. 1A illustrates forming or placing vias V over panel $P_I$, such that one via can shared by more than one submount A to I. In some aspects, a single via V can be shared by a plurality of submounts A to I. That is, upon singulation of submounts A to I from panel $P_I$, each via V can be separated into multiple and/or a plurality of portions and positioned on multiple adjacent submounts. For example in some aspects, vias V can be formed proximate a centerline (or lines parallel to a centerline) of panel $P_I$, such that it can be shared by two or more adjacent submounts upon singulation of submounts along broken lines. That is, a first via of a plurality of vias V can be disposed proximate a middle of panel $P_I$, but upon separation or singulation of submounts A to I, the first via can become apportioned such that it is disposed proximate the corner of each of submounts A, B, E and F (e.g. divided and shared by at least four submounts). A second via of the plurality of vias V can be formed such that upon singulation of submounts A to I, the second via can become apportioned such that it is disposed proximate the corners of each of submounts B, C, F, and G. Notably, upon singulation from panel $P_I$, vias V can be exposed along external surfaces or sides of submounts A to I, (see also FIG. 9).

Figure 1B:
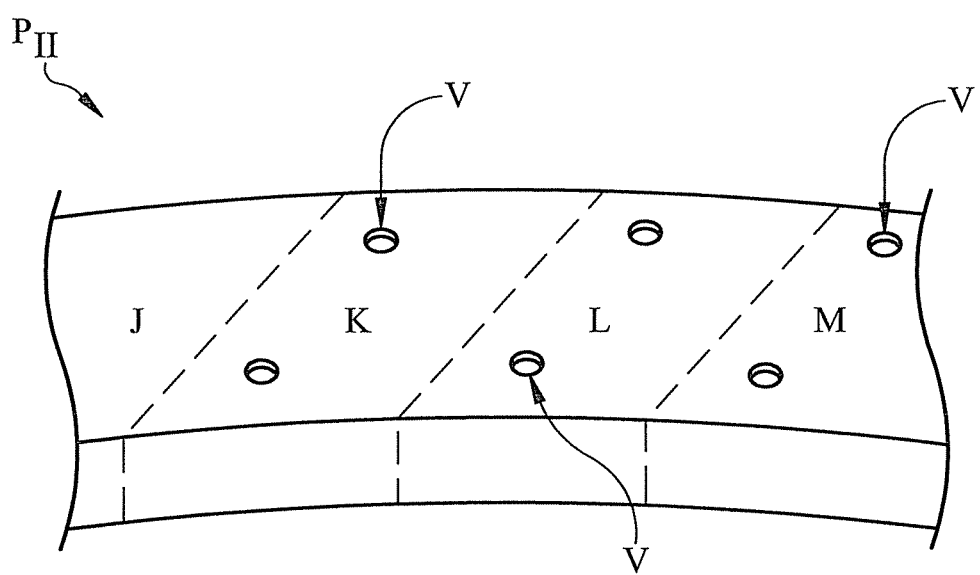

FIG. 1B illustrates forming or placing vias V which may not become shared by adjacent submounts upon singulation. That is in some aspects, panel $P_{II}$ can be provided with a plurality of vias V which do not become separated or divided into multiple portions and positioned upon multiple adjacent submounts. In some aspects, vias V each remain wholly formed or fully in tact upon singulation of panel $P_{II}$ into multiple submounts J to M. In some aspects, vias V can be fully disposed internally within one of submounts J to M upon singulation from panel $P_{II}$. In some aspects, more than one via V can be provided per submount J to M, such that upon singulation from panel $P_{II}$, submounts J to M contain more than one via V internally disposed within a portion thereof. In some aspects, each submount can comprise two vias V, three vias V, four vias V, or more than four vias V.

Figure 1C:
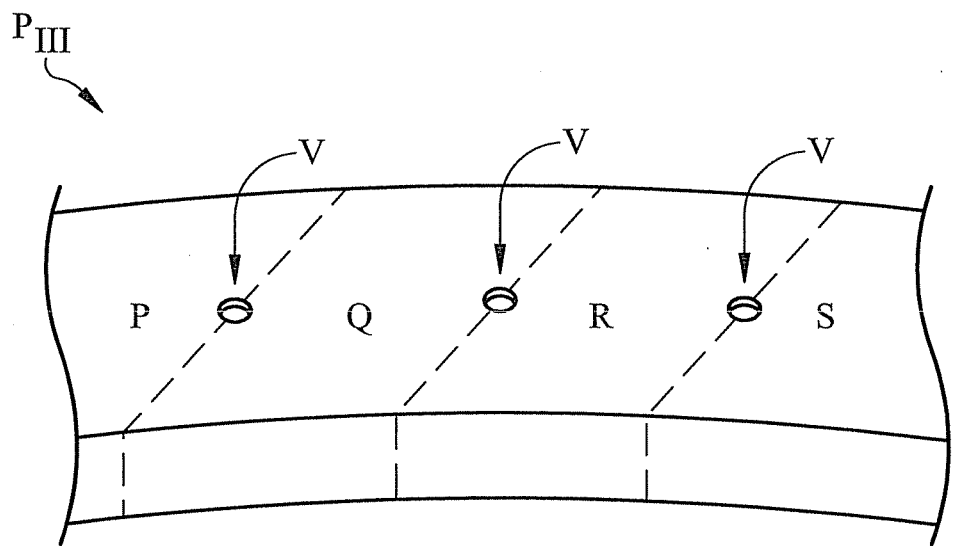

FIG. 1C illustrates forming or placing vias V over panel $P_{III}$, such that one via can shared by more than one submount P to S. That is, upon singulation of submounts P to S from panel $P_{III}$, each via V can be separated into at least two portions and positioned on at least two adjacent submounts. For example in some aspects, vias V can be formed proximate a centerline (or lines parallel to a centerline) of panel $P_{III}$, such that it can be shared by at least two adjacent submounts upon singulation of submounts along broken lines. That is, a first via of a plurality of vias V can be disposed proximate a middle of panel $P_{III}$ but upon separation or singulation of submounts P to S, the first via can become apportioned such that it is disposed proximate adjacent, opposing sides of each of submounts P and Q. A second via of the plurality of vias V can be formed such that upon singulation of submounts P to S, the second via can become apportioned such that it is disposed proximate adjacent and opposing sides of each of submounts Q and R. Notably, upon singulation from panel $P_{III}$, vias V can be exposed along external surfaces or sides of submounts P to S (see e.g., exposed vias or electrical elements 108 in FIG. 9).

Individual submounts A to S, can comprise any size, overall shape, and/or cross-sectional shape. For illustration purposes, individual submounts A to S having a substantially square or rectangular cross-sectional shape are shown, however, any other non-rectangular shape is contemplated herein. Notably, panels and/or respective submounts A to S, can comprise the building block of customized SMD type emitter components and/or packages described herein. In some aspects, customized components and/or packages can be devoid of a reflector cavity, thereby lowering manufacturing costs. A multitude of different customized components, having domes, lenses and/or dome shaped optical materials affixed thereto via natural surface tension (e.g., without the added cost associated with molding a lens) can be provided without the expense of creating custom fabricated or molded components.

In some aspects, panels $P_I$ to $P_{III}$ can be similar to and/or be provided using methods described in U.S. utility patent application Ser. No. 11/982,275, filed Oct. 31, 2007 and/or U.S. utility patent application Ser. No. 12/757,891, filed Apr. 9, 2010. The entire contents of each of these references are hereby incorporated by reference herein.

Figure 2:
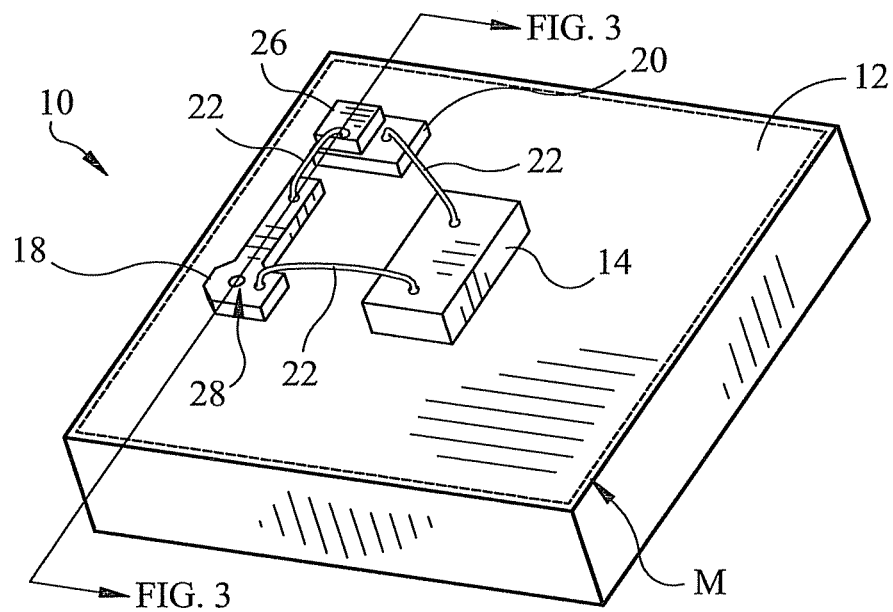
FIG. 2 is a perspective top view illustrating submount based light emitter component according to the disclosure herein.
Figure 3:
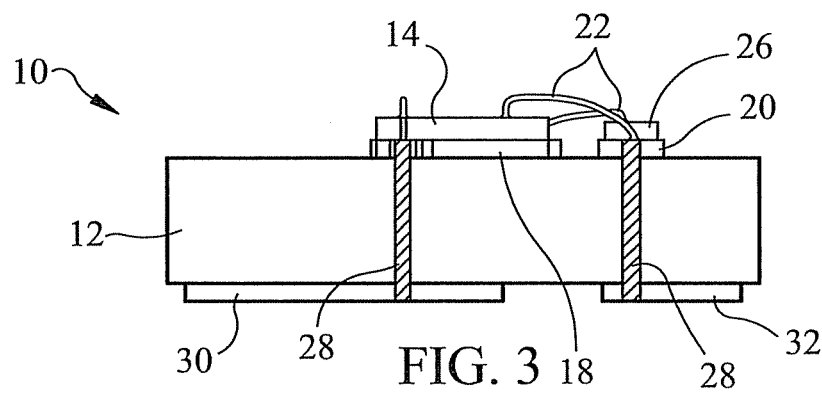
FIG. 3 is a cross-sectional view illustrating a submount based light emitter component according to the disclosure herein.

FIGS. 2 and 3 are top perspective and cross-sectional views, respectively, illustrating a submount based light emitter component, generally designated 10. In some aspects, component 10 can be singulated from a panel (FIGS. 1A to 1C) after die attach and/or wirebonding, but prior to encapsulation. In other aspects, as described in FIG. 8, submount based components can be singulated after encapsulation (e.g., formation of an optical element, dome, or lens). Light emitter component 10 can comprise substrate or submount based packages for surface mount device (SMD) applications. SMD type components can comprise electrical contacts, typically along the bottom of the device, for directly connecting to and/or electrically and thermally connecting with external heat sinks or circuit components such as a PCB or a MCPCB. Light emitter component 10 can comprise a non-metallic based submount 12, similar to individual submounts A to S described in FIGS. 1A to 1C. Submount 12 can comprise a non-metallic material. In some aspects, submount 12 can comprise a ceramic based material, such as a transparent ceramic material for maximizing light extraction and reflectance. In some aspects, a submount according to any of the embodiments described herein can have a desirable thermal conductivity. For example and without limitation, a submount, such as submount 12 for example, can have a thermal conductivity of greater than 5 W/mK, greater than 10 W/mK, greater than 50 W/mK, greater than 100 W/mK, greater than 150 W/mK, or greater than 200 W/mK. In more particular aspects, the thermal conductivity of the submount can be approximately 20 W/mK (+ or −5 W/mK), such as for when the submount comprises alumina, or the thermal conductivity of the submount can be approximately 170 W/mK (+ or −5 W/mK), such as for when the submount comprises aluminum nitride.

In some aspects, at least one or more light emitter chip, such as an LED chip 14, can be provided and over and/or supported by submount 12. In some aspects, LED chip 14 can be disposed proximate a center of submount 12. The at least one LED chip 14 can be configured to activate a yellow, red, and/or green phosphor (not shown) disposed either directly over LED chip 14 and/or directly over a portion of emitter component 10 for producing cool and/or warm white output. In some aspects, more than one LED chip 14 can be provided (e.g., see FIG. 7B). Multiple LED chips, where provided, can comprise a same or different colors selected from the group of blue, blue shifted yellow (BSY), cyan, green, red, yellow, red-orange, or amber. Any color of LED chip 14 can be provided. In some aspects, LED chip 14 can directly attach and/or directly mount to a portion of the ceramic based, non-metallic submount 12 via an index matched adhesive or epoxy material (not shown). In some aspects, LED chip 14 can directly attach to a portion of submount 12 via a silicone or epoxy based material. In other aspects, an optional layer of material (not shown) can be disposed between submount 12 and LED chip 14.

Figure 9:
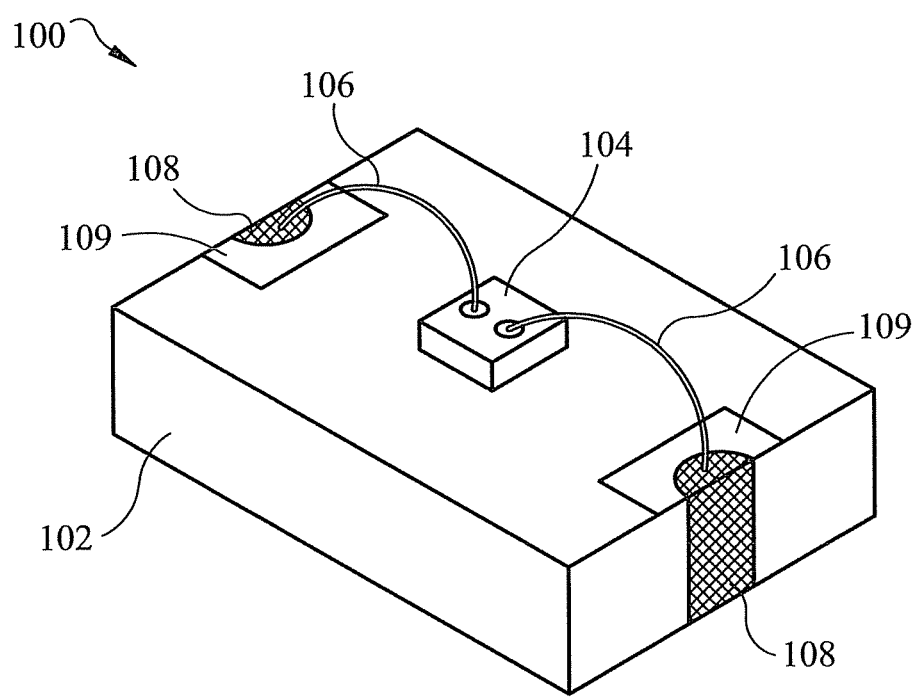
FIG. 9 is a top perspective view illustrating another embodiment of a submount based light emitter component according to the disclosure herein.

Light emitter component 10 can further comprise at least one metallic trace or electrical contact, generally designated 18, that can be disposed along a top side or top surface of submount 12 and spaced apart from LED chip 14. In some aspects, light emitter component 10 can comprise first and second electrical contacts 18 and 20, respectively, of opposing electrical polarity configured for passing electrical current into and out of LED chip 14, causing the illumination thereof. In some aspects, each of first and second electrical contacts 18 and 20 can be fully disposed on a top side or top surface of submount 12, and can be spaced apart. In some aspects, LED chip 14 can electrically communicate to first and second electrical contacts 18 and 20 via wirebonds 22. As illustrated in FIG. 9, metallic traces (e.g., or exposed vias) can also extend down lateral sides between a top surface and a bottom surface of submount 12.

In some aspects, LED chip 14 can have a clearance from or around it such that there is no metal close by. In one example, electrical contacts 18 and 20, which are metallic traces, can be positioned a distance away from LED chip 14 such that there is no metallic trace within 100 μm of LED chip 14.

Component 10 can further comprise one or more elements for protecting against damage from electrostatic discharge (ESD). In the embodiment shown, an ESD protection device 26 can be mounted over a portion of second electrical contact 20 and wirebonded to first electrical contact 18 via wirebond 22. ESD protection device 26 can comprise a vertical device that is reversed biased or electrically connected in reverse polarity to LED chip 14. ESD protection device 26 can for example comprise a vertical silicon (Si) Zener diode, a dual back-to-back Zener diode, a different LED chip arranged in parallel and reverse biased to LED chip 14, a surface mount varistor, and/or a lateral Si diode. ESD protection device 26 can be mounted using any known material and/or technique. ESD protection device 26 can be smaller than LED chip 14 so that it does not cover an excessive area on the surface of the submount 12, and so that it does not block and/or absorb a significant amount of light. ESD protection device 26 can prevent excessive current from passing through component 10 from an ESD event by providing an alternative path for current flow besides the LED chip 14.

Wirebonds 22 can comprise any suitable electrically conductive material such as Au, Ag, Al, Sn, Cu, alloys thereof, and/or combinations thereof. It is understood that in other embodiments of a component according to the present subject matter can be provided without an ESD protection device 26 or with an ESD protection device 26 that is external to component 10. Notably, ESD protection device 26 can also be positioned proximate an outermost edge of submount 12, therefore reducing and/or minimizing any negative effects (e.g., blocking, absorbing, etc.) on light output.

As FIG. 2 illustrates in broken lines, in some aspects, submount 12 can, but does not have to comprise a meniscus holding or meniscus forming feature, generally designated M disposed proximate the border of submount 12 adapted to confine a liquid matrix encapsulant material within the boundaries of submount 12. For example, in some aspects, meniscus forming feature M can comprise a screen printed lip, protrusion, bead, channel, or boundary of negligible height applied proximate the edges of submount 12 for physically holding an optical element (44, FIG. 4) applied in liquid form to the edges of submount 12 prior to a curing or hardening step. For example, meniscus forming feature M can comprise physical and/or chemical properties adapted to confine edges of an optical element (e.g., 44, FIG. 4) proximate the edges of submount 12, and not allow the optical element, when in liquid form and before hardening, to surpass or leak past the outermost top edges of submount 12. In some aspects, meniscus forming feature M can comprise a polymer or a line of non-wetting or hydrophobic material located proximate the edges of submount 12, as shown in broken lines, such that an optical element, if and when applied in liquid form, will have a border substantially even with the edges of submount. In some aspects, meniscus forming feature M can for example comprise channels, bumps, grids, raised, lowered, or stenciled boundary features. In some aspects, meniscus forming feature M can be disposed along only two opposing edges of submount 12. In other aspects, meniscus forming feature M can be disposed along all four edges of submount 12, as illustrated.

As FIG. 3 illustrates, in some aspects, first and second electrical contacts 18 and 20 can electrically communicate to respective first and second bottom electrical contacts 30 and 32 using one or more internally disposed thru-holes or vias 28. Vias 28 can extend internally within a portion of submount 12 depending on how placed within panel (e.g., FIG. 1B) and how panel is subdivided into individual submounts. For example, vias 28 can be fully internal to, intact, and/or fully contained within portions of submount 12 as shown, or in other aspects, vias 28 can be apportioned and exposed such that they are disposed along one or more external sides of submount 12 (e.g. FIGS. 1A, 1C, and 9). Vias 28 can comprise conduits for transferring electrical current between first and second top contacts 18 and 20 and respective first and second bottom contacts 30 and 32. Thus, vias 28 also comprise conduits for passing electrical current to and from LED chip 14 within component 10.

Referring generally to FIGS. 2 and 3, in some aspects, submount 12 can comprise a portion of material that has been singulated from a large, non-metallic panel (e.g., $P_I$, $P_{II}$, $P_{III}$ FIGS. 1A to 1C) however, individually formed and/or pressed submounts are also contemplated herein. Generally, it is desirable to provide a substrate or submount 12 that is highly reflective to visible light (e.g., greater than about 90%), and which can provide conduction of heat as well as mechanical support. In some aspects, non-metallic and/or ceramic materials containing $Al_2O_3$ exhibit such desirable qualities. Accordingly, submount 12 can comprise a ceramic based body of material such as $Al_2O_3$ and/or containing $Al_2O_3$.

In some aspects, submount 12 can comprise a ceramic body that can be cast from low temperature co-fired ceramic (LTCC) materials or high temperature co-fired ceramic (HTCC) materials and related processes. In one embodiment, submount 12 can be individually cast from a thin green ceramic tape and subsequently fired. Submount 12 can also be cast and subsequently fired and singulated from a panel of submounts formed from a thin green ceramic tape. Where used, the ceramic tape can comprise any ceramic filler material known in the art, for example, submount 12 can comprise a glass ceramic, such as $Al_2O_3$ or aluminum nitride (AlN) having 0.3 to 0.5 weight percent of glass frits. The glass frits can be used as a binder and/or sintering inhibitor within the ceramic tape when the tape is fired.

In some aspects, the green ceramic tape can be formed by casting a thick layer of a slurry dispersion of the glass frit, ceramic filler, one or more additional binders, and a volatile solvent. The cast layer can be heated at low temperatures to remove the volatile solvent. A green ceramic tape used for submount 12 can advantageously comprise any thickness desired, thus contributing to a thinner size when desired. Submount 12 can further comprise a ceramic material having any of a variety of scattering particles contained therein. Examples of suitable scattering particles can for example comprise particles of $Al_2O_3$, $TiO_2$, $BaSO_4$, $ZrO_2$, and/or AlN. Submount 12 can be produced by thin- or thick-film processing techniques available at and including products available from CoorsTek, headquartered in Golden, Colo. Such substrates or submounts 12 can optionally be fired along with other materials (e.g., zirconia, $ZrO_2$) to further improve optical and mechanical properties. LED chips can be mounted to the submount after firing and/or sintering.

Submount 12 can comprise any suitable size, shape, orientation, and/or configuration. For illustration purposes, a substantially square shaped submount 12 is shown, however, any shape of submount is contemplated herein. For example, any one of a substantially rectangular, circular, oval, rounded, regular, irregular, or asymmetrically shaped submount is also contemplated herein. Submount 12 can for example comprise a substantially square or rectangular shape having at least one side of at least approximately 25 millimeters (mm) or less, such as approximately 20 mm or less, approximately 15 mm less, approximately 10 mm or less, approximately 6 mm or less, approximately 3 mm or less, approximately 2 mm or less, and/or a submount having at least one side of approximately 1 mm or less. Submount 12 can for example comprise a thickness of approximately 2 mm or less, such as approximately 1 mm or less, approximately 0.5 mm or less, or approximately 0.25 mm or less. In some aspects, submount 12 can comprise a square having a length and width of approximately 3 mm each, and a thickness of 0.635 mm.

As FIGS. 2 and 3 further illustrate, LED chip 14 can comprise substantially straight and/or beveled (e.g., sloped or inclined) lateral sides and can comprise any shape, size, dimension, structure, build, and/or color. More than one LED chip 14 can also be used (see e.g., FIG. 7B). Where used, multiple chips can comprise the same shape, size, dimension, structure, build and/or color or different shapes, sizes, dimensions, structures, builds, colors, and/or combinations thereof. LED chips 14 can comprise a growth substrate or a carrier substrate, and can comprise a vertically structured chip (e.g., anode and cathode on opposing surfaces of LED chip 14) or a horizontally structured chip (e.g., anode and cathode on a same surface). For illustration purposes, a horizontally structured LED chip 14 is illustrated, where both the anode and the cathode can be disposed on the upper surface in the form of two bond pads. However, both contacts (e.g., the anode and cathode) could be disposed on a bottom surface of the LED chip 14 and/or on opposing top and bottom surfaces as well.

LED chip 14 can comprise any size and/or shape. LED chip 14 can be substantially square, rectangular, regular, irregular, or asymmetrical in shape. In some aspects, LED chip 14 can, for example, comprise a footprint where at least one side measures approximately 1000 μm or less, such as approximately 900 μm or less, approximately 700 μm or less, approximately 600 μm or less, approximately 500 μm or less, approximately 400 μm or less, approximately 300 μm or less, approximately 200 μm or less, approximately 100 μm or less, and/or combinations thereof where multiple LED chips 14 are used. Any dimension of LED chip 14 is contemplated.

In some aspects, first and second electrical contacts 18 and 20 and/or respective first and second bottom electrical contacts 30 and 32 can be deposited or electroplated via electroplating or electroless plating techniques. For example, first and second electrical contacts 18 and 20 and/or respective first and second bottom electrical contacts 30 and 32 can comprise one more layers of Cu, titanium (Ti), nickel (Ni), Ag, electroless Ag, Au, electroless nickel immersion gold (ENIG), Sn, palladium (Pd), electrolytic or immersion Au, or another other material which can be applied via a deposition process, such as physical deposition, sputtering, e-beam or, electroplating, and/or electroless plating processes. Different layers of metals can be applied or coated in layers over each other. For example, a layer of Ti can be deposited directly over submount 12 and can be coated with one or more layers of Ag and Cu. In other aspects, different and/or alternating metallic layers can be applied over submount 12. First and second electrical contacts 18 and 20 and/or respective first and second bottom electrical contacts 30 and 32 can further comprise one or more layers of Ag, either alone or in combination with layers of electroplated Ti, Ni, Cu, and/or Au.

In other aspects, first and second electrical contacts 18 and 20 and/or respective first and second bottom electrical contacts 30 and 32 can comprise metallic bodies or portions of material that can be attached to submount 12 via adhesive, solder, glue, epoxy, paste, silicone, or any other material. In further aspects, first and second electrical contacts 18 and 20 and/or respective first and second bottom electrical contacts 30 and 32 can comprise metallic bodies or portions of material that can be pressed into a green ceramic tape and then co-fired with submount 12. In other yet further aspects, first and second electrical contacts 18 and 20 and/or respective first and second bottom electrical contacts 30 and 32 can be applied via a conductive paste screen-printed over an HTCC submount or panel and fired. In some aspects, a conductive Ag paste can be used such as silver paste #7095 available from DuPont Electronics.

As FIGS. 2 and 3 illustrate, component 10 can comprise an SMD, which can advantageously allow for first and second bottom electrical contacts 30 ad 32 to be mounted over and electrically or thermally communicate with an external heat sink or power source (not shown). In some aspects, first and second bottom electrical contacts 30 and 32 can be configured to pass electrical signal or current from the outside power source (not shown) such as a circuit board, a PCB, a MCPCB, or other electrical source into the one or more LED chips 14 by passing electrical current into respective first and second electrical contacts 18 and 20 through vias 28.

Portions of first and second bottom electrical contacts 30 and 32 can be soldered, welded, glued, or otherwise physically, electrically, and/or thermally attached to the external power source (not shown). LED chips 14 can illuminate upon receiving electrical current passed between respective top and bottom electrical contacts or traces. In some aspects, one set of respective top and bottom contacts (e.g., first electrical contacts 18 and 30) can comprise an anode and the other respective set (e.g., second electrical contacts 20 and 32) can comprise a cathode. The anode and cathode can be configured to electrically connect with LED chip 14 via wirebonds 22.

In some aspects, a first wirebond 22 can connect to first electrical contact 18 and a second wirebond 22 can connect to second electrical contact 20. That is, in some aspects LED chip 14 can be horizontally structured. In other aspects, vertically structured LED chips 14 can be provided. In some aspects, one end of wirebond 22 can be configured to physically and electrically connect with an electrical contact (e.g., a bond pad) disposed on LED chip 14. An opposing end of wirebond 22 can physically and electrically connect with and/or directly or indirectly attach to opposing electrical contacts, such as first and second electrical contacts 18 and 20. Wirebond 22 can comprise any suitably electrically conductive material such as a metal, in some aspects, a wire comprising gold (Au) or Au-alloy.

Notably, first and second electrical contacts 18 and 20 can comprise different sizes and/or shapes. In some aspects, first electrical contact 18 can comprise a first portion disposed over via 28 and a second, leg portion extending therefrom. The extended portion can extend towards ESD chip 26, and can allow for a shorter wirebond 22, thereby, advantageously reducing failures due to breakage of an excessively long wirebond 22. In some aspects second electrical contact 20 can comprise a square or rectangular shaped pad disposed over via 28 and sized for supporting ESD chip 26. In some aspects, wirebonds 22 between LED chip 14 and contacts and/or ESD chip 26 and contacts can comprise a substantially downwardly curving loop and/or low lying wire, such as wirebonds described in co-pending and commonly owned and assigned U.S. patent application Ser. No. 13/607,217, filed on Sep. 7, 2012 and which is hereby incorporated by reference herein in its entirety.

Notably, first and second electrical contacts 18 and 20 comprise relatively small surface areas or portions of metal with respect to the top surface area of submount 12. In some aspects, smaller traces or contacts can contribute to brighter components, as areas which can absorb light (e.g., metallic traces) are reduced or minimized. Notably, first and second electrical contacts 18 and 20 can also be positioned a distance away from LED chip 14 and proximate outermost edges of component 10 for reducing or minimizing interference with light.

In some aspects, a submount according to any embodiment herein can comprise a first side having a first surface area, and the first surface area can comprise an electrical contact area on the first surface area. The total electrical contact area can be made up entirely by (formed by) or at least partially by the first and second electrical contacts. The total electrical contact area can therefore be an addition of only the first and second electrical contact areas in one aspect. In another aspect, the total electrical contact area can be an addition of the first and second electrical contact areas plus any additional electrical contact areas. The total electrical contact area can be less than half of the first surface area of the first side of the submount as further described below.

In some aspects, submount 12 can comprise a length and width of approximately 3 mm×3 mm, or a surface area of approximately 9 mm². In some aspects, first and second electrical contacts 18 and 20 together can comprise a total surface area of less than approximately half (50%) of the surface area of submount 12 (e.g., less than approximately 4.5 mm² total surface area), less than approximately 40% of the surface area of submount 12 (e.g., less than approximately 3.6 mm² total surface area), less than approximately 30% of the surface area of submount 12 (e.g., less than approximately 2.7 mm² total surface area), or less than approximately 20% of the surface area of submount 12 (e.g., less than approximately 1.8 mm² total surface area).

In some aspects, first and second electrical contacts 18 and 20 can be disposed along a same edge of submount 12 and spaced apart from each other. In some aspect, two vias 28 can also be disposed along a same edge of submount 12. ESD device 26 can be disposed over second electrical contact and connected to an extending leg portion of first electrical contact 18. The leg portion can comprise an extension from a main body portion having at least one via 28, and the main body portion can be thicker than the leg portion. In some aspects, the sizes of first and second electrical contacts 18 and 20 can be minimized.

Notably, the technology described herein allows for substantially flat submounts 12 to be formed into a multitude of different and/or customized packages or components without having to incur expenses associated with custom fabricated packages. Notably, this technology also allows for low profile components 10 which do not require formation and/or cost associated with providing a reflector cavity. As noted above, component 10 can for example comprise a ceramic based light emitter component (e.g., comprising a ceramic based submount) for providing improved light scattering and reflection and, therefore, improved efficiency, brightness, and light extraction capabilities. Ceramic based submounts may also desirable for use in light emitter components described herein for improved thermal management properties. For example, HTCC $Al_2O_3$ materials exhibit relatively low thermal resistance, low moisture sensitivity, superior reliability at high temperature environments, and the superior ability to dissipate heat. Notably, varying the size, shape, number, placement, and/or location of any one of the traces (e.g., first and second contacts 18 and 20), vias 28, LED chip 14, and/or ESD protection device 26 can allow for a multitude of differently sized and/or shaped customized components to be formed over submount 12. In addition, as described below, customized, dispensed optical elements can also be provided over submount, either prior to or after singulation of submount from a larger panel.

Figure 4:
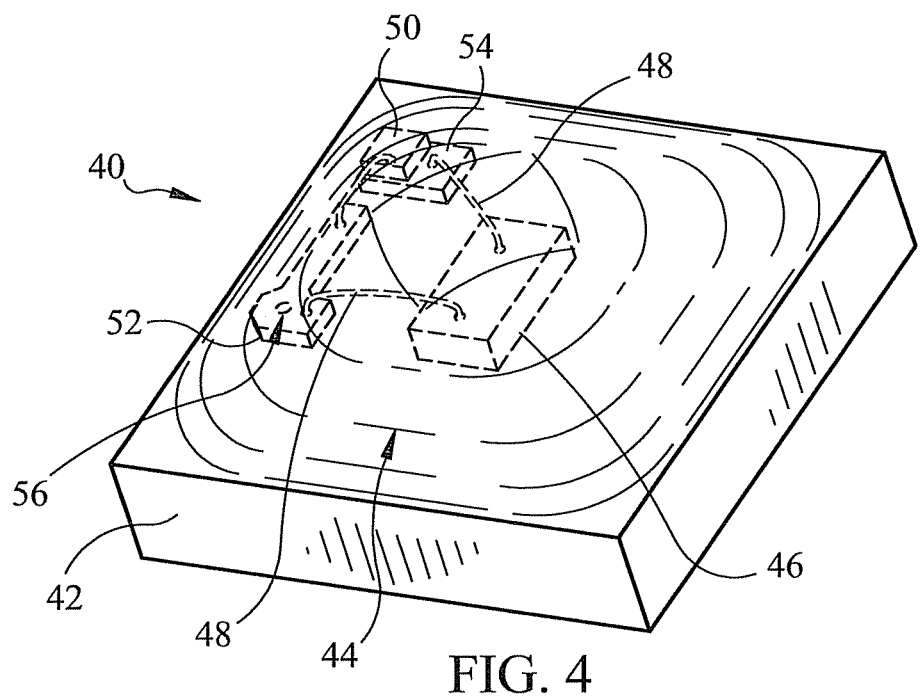
FIG. 4 is a perspective top view illustrating another submount based light emitter component according to the disclosure herein.
Figure 5:
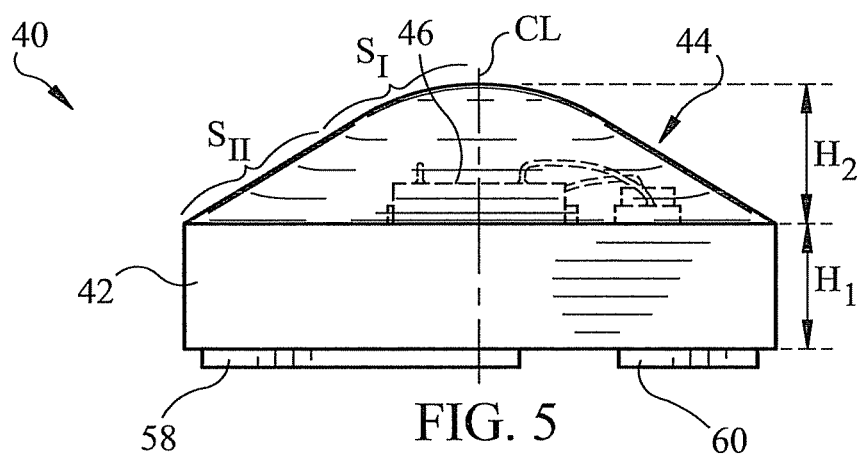
FIG. 5 is a side view illustrating a submount based light emitter component according to the disclosure herein.
Figure 6:
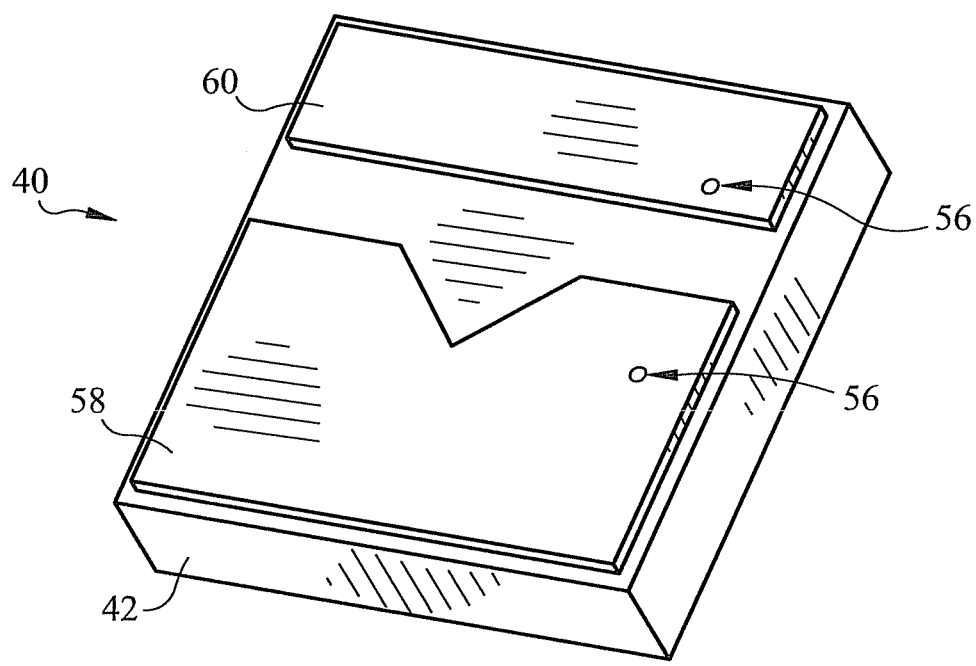
FIG. 6 is a bottom view illustrating a submount based light emitter component according to the disclosure herein.

FIGS. 4 to 6 illustrate another embodiment of a light emitting component, generally designated 40, which can be similar in form and function as component 10, but can comprise further comprise an optical element. In some aspects, component 40 can comprise a submount 42 for supporting an optical element, generally designated 44 and one or more LED chips 46. Optical element 44 can comprise a dome or lens, and can be transparent, semi-transparent, or opaque. For illustration purposes, elements disposed below and/or underlying dome 44 are illustrated in broken lines as such features may not be completely visible externally from the component 40.

In some aspects, optical elements 44 can for example comprise a domed shape for producing a certain shape or beam pattern of light emission. In some aspects, optical element 44 can be, but does not have to be molded and/or cured using known processes. That is, in some aspects, optical element 44 can comprise an encapsulant and the encapsulant can comprise a dome or lens portion, and at least a portion of the encapsulant can be disposed on a same surface that the LED chip is mounted to, and/or a same surface that traces or first and second electrical contacts can be deposited to. In some aspects, optical element 44 can be formed directly and/or indirectly over a top surface of submount 12, and can be disposed over at least one LED chip 46. An array of lenses, domes, or optical elements 44 can be molded and/or positioned over a corresponding array of LED chips 14 and/or over a corresponding portion of submount panels (e.g., $P_I$, $P_{II}$, $P_{III}$, FIGS. 1A to 1C).

Notably, in some aspects optical element 44 may not molded. That is, in some aspects, optical element 44 can comprise a silicone matrix, encapsulant, or plastic material which can be deposited or dispensed directly over submount 12 without the time or expense of having to overmold a lens. Notably, optical element 44 can comprise an improved and/or lowered dome height to width ratio, which advantageously can allow optical element 44 to extend, at least substantially, extend to outermost edges of submount 42 while being affixed thereto via surface tension in liquid form. In some aspects, optical element 44 can fully extend to the outermost edges of submount 42. Optical element 44 can be subsequently cured. In some aspects, optical element 44 can be dispensed and optionally cured upside-down to form the substantially convex dome shaped. In some aspects, optical element 44 can be dispensed over submount 42 and/or a panel of submounts (e.g., panels FIGS. 1A to 1C), affixed to submount 42 and/or panel of submounts via surface tension, and subsequently cured.

Optical element 44 can provide both environmental and/or mechanical protection of light emitter component 40. An optional layer of optical conversion material (not shown) can be applied directly over the one or more LED chips 46 and/or over one or more surfaces of optical element 44 (e.g., an inner or outer surface) for producing cool and/or warm white output. Optical conversion material can comprise one or more phosphors or lumiphors (e.g., yellow, red, and/or green phosphor) which can be activated by light emitted from the one or more LED chips 46. In some aspects, optical conversion material can be provided when optical element 44 is in liquid form, and dispersed therein as optical element 44 is cured.

As in component 10, component 40 can comprise an ESD protection device 50 and first and second electrical contacts 52 and 54, respectively. ESD protection device 50 can, but does not have to comprise a vertically structured device (e.g., opposing bond pads on the top and bottom surfaces thereof). ESD protection device 50 can be reverse biased to at least one LED chip 46. LED chip 46 can electrically connect to first and second electrical contacts 52 and 54, respectively, via wirebonds 48. First and second electrical contacts 52 and 54 can comprise opposing electrical polarities (e.g., an anode and a cathode).

In some aspects, component 40 can further comprise vias 56 extending internally within submount 52 for electrically connecting first and second electrical contacts 52 and 54 to first and second bottom electrical contacts 58 and 60 (FIG. 5) similar to vias 28 of previously described component 10 illustrated in FIG. 3. In some aspects, LED chip 46 can comprise a horizontal chip having two electrical contacts of opposing electrical polarities (e.g., anode and cathode in the form of bond pads) on an upper surface of the LED chip 46, such that the upper surface of chip can be wirebonded to each of first and second electrical contacts 52 and 54. First and second electrical contacts can pass electrical current into LED chip 46 for illuminating the LED chip 46. As FIG. 4 illustrates, first and second contacts 52 and 54 can comprise different shapes, sizes, and/or surface designs.

Referring now to FIG. 5, in some aspects, LED chip 46 can be provided proximate a centerline CL of component 40. In some aspects, component 40 can comprise a submount 42 comprising a thickness or submount height $H_1$ for example of approximately 0.05 mm or more, approximately 0.1 mm or more, approximately 0.5 mm or more, or more than approximately 0.6 mm.

In some aspects, optical element 44 can for example comprise a dome height $H_2$ of approximately 0.4 mm or more, approximately 0.45 mm or more, approximately 0.55 mm or more, approximately 0.6 mm or more, or approximately 0.65 mm or more. In some aspects, a ratio of submount height $H_1$ to dome height $H_2$ can be approximately 1:1 (i.e., a ratio of 1). That is, in some aspects submount height $H_1$ and dome height $H_2$ can be approximately equal. In other aspects, a ratio of submount height $H_1$ to dome height $H_2$ can be approximately 0.05 or more, approximately 0.90 or more, approximately 0.94 or more, or approximately 0.96 or more. Optical element 44 can comprise a substantially convex surface; however, concave surfaces, roughened surfaces, and/or any combination of concave, convex, and/or roughened surfaces are also contemplated herein.

As FIG. 5 further illustrates and in some aspects, optical element 44 can extend to the outermost edges of submount 42 and/or substantially to the outermost edges of submount 42. Optical element 44 can include a width that is approximately equal to the width of submount 42. That is, optical element 44 can for example comprise a width of approximately 1 mm or more, approximately 2 mm or more, approximately 3 mm or more, and/or a width of approximately 5 mm or more. In some aspects, optical element 44 and submount 42 can each comprise a width of approximately 3 mm. Thus, in some aspects, optical element 44 can comprise a dome height $H_2$ to width ratio of approximately 0.2 or more, or less than a 2:1 ratio of dome height to width. That is, in some aspects, optical element 44 can for example comprise a dome height $H_2$ to width ratio of less than approximately 0.5, less than approximately 0.4, less than approximately 0.3, and/or less than approximately 0.2. Notably, components described herein can comprise low profile parts, such as having less than a 2:1 ratio of dome height to width. This is unexpected and advantageously allows for custom components having smaller designs at a same brightness level while improving ease of manufacture. For example, components having a small height to width ratio can advantageously allow optical elements 44 to be encapsulated via dispensing while adhering to edges of submount 42 via surface tension, and this can obviate the time and/or expense associated with molding optical elements. Notably, varying the dome height $H_2$ can allow for a multitude of differently sized and/or shaped customized components to be formed over submount 42.

As FIG. 5 further illustrates, in the sectional view optical element 44 comprises a profile. In some aspects, a first portion or first section $S_I$ of the profile of optical element 44 can comprise a substantially curved portion. The curved portion can be substantially convex, and extend proximate to the center top portion of optical element 44, for example, about either side of centerline CL. In some aspects, a second portion or second section $S_{II}$ of the profile of optical element 44 can comprise a substantially linear or straight portion. That is, in some aspects optical element 44 can be substantially curved at a top portion of the dome, and the curve can decrease and become substantially straight the further the dome extends from centerline CL (e.g., towards the edges of submount 42). In some aspects, optical element 44 is non-curved proximate the outside, or outer edges of submount as illustrated by second section $S_{II}$.

FIG. 6 illustrates a bottom or back side of light emitter component 40. One or more bottom electrical contacts can be disposed on a bottom side of submount 42, which opposes the side to which LED chips can be mounted or die attached. In some aspects, electrical vias 56 can electrically connect first and second electrical contacts (i.e., 52 and 54, FIG. 4) to respective first and second bottom electrical contacts 58 and 60. First and second bottom electrical contacts 58 and 60 can be deposited via electroplating and/or electroless plating processes. In some aspects, bottom surface of submount 42 can comprise more than two contacts with more than two vias 56, and can also include more than two top contacts, to be able to individually address various elements (e.g., multiple LEDs of different colors). In some aspects, first and second bottom electrical contacts 58 and 60 can be deposited via electroplating and/or electroless plating processes. In some aspects, electrical contacts 58 and 60 can comprise one or more layers of material, such as one or more layers of Au, Sn, Ti, Ag, Cu, Pd, ENIG, and/or any alloy or combination thereof. Electrical contacts 58 and 60 can also be deposited via physical deposition methods, sputtering, screen-printing, and/or any other methods previously described above. Notably, first and second bottom electrical contacts 58 and 60 can comprise different sizes and/or shapes. For example, in some aspects first electrical contact 58 can comprise a V-shaped notch for indicating electrical polarity. In some aspects, the V-shaped notch indicates a cathode. In other aspects, the V-shaped notch can indicate an anode. Thus, time and expense associated with otherwise marking the component (e.g., via scribing, etc.) can be obviated.

Figure 7A:
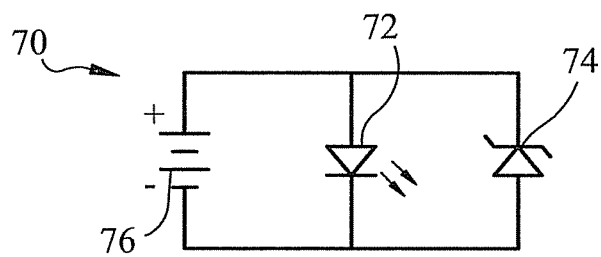
FIGS. 7A and 7B are circuit diagrams illustrating submount based light emitter components according to the disclosure herein.
Figure 7B:
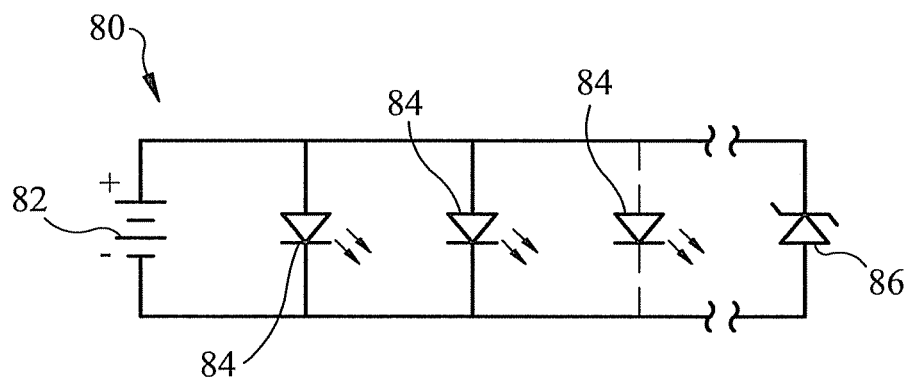

FIGS. 7A and 7B are circuit diagrams that schematically illustrate an example of electrical connection of submount based light emitter components described herein. FIG. 7A illustrates a light emitter component 70 comprising an LED chip 72 and an ESD protection device 74 electrically connected in parallel to an electrical power or current supply 76. LED chip 72 can comprise any size, shape, build, and/or color. FIG. 7B illustrates a light emitter component 80 comprising multiple LED chips 84 electrically connected in parallel to a power supply 82. Component 80 can further comprise an ESD protection device 86 reverse biased to LED chips 84. LED chips 84 can comprise a same color or different colors. LED chips 84 can comprise a same size and a same shape, or different sizes and different shapes. Any number of LED chips 84 can be provided. In some aspects, a plurality of LED chips 84 can be electrically connected in series. In some aspects, a plurality of LED chips 84 can be electrically connected in a combination of series and parallel arrangements. In some aspects, multiple mutually exclusive and/or individually addressable (e.g., more than two contacts) LED chips can also be provided over a single submount.

LED chips 72 and 84 described herein can embody solid state emitters used alone and/or in combination with optical conversion material comprising, for example, phosphors or lumiphors to emit light of various colors, color points, or wavelength ranges, such as light that is primarily white, blue, cyan, green, yellow, amber, or red. In some aspects light emitter components described herein can comprise one or more LED chips 72 and 84 that are primarily blue, which when illuminated, can activate a yellow phosphor disposed over the one or more chips (e.g., phosphor can be at least partially directly disposed over LED chips and/or on a portion of the light emitter components that is disposed over LED chips such that the chips comprise blue shifted yellow (BSY) chips.

In alternative embodiments, primarily red LED chips 72 and 84 can be included in emitter components described herein and can be used alone and/or combination with a BSY chip. In some aspects, a red LED chip can also optionally be disposed below a phosphor, encapsulant, dome, lens and/or combinations thereof, such as optical element 44 (FIG. 4) with a phosphor layer and/or uniformly dispersed phosphors for mixing to produce warm white output.

As FIG. 7B illustrates, component 80 can comprise more than one LED chip 84 such as a plurality and/or array of LED chips 84. Each chip in the plurality or array of LED chips 84 can comprise approximately the same wavelength (e.g., selected from the same targeted wavelength bin). In the alternative, at least a first LED chip 84 of the plurality of chips can comprise a different wavelength than at least a second LED chip of the plurality of chips (e.g., at least a first LED chip 84 could be selected from a different targeted wavelength bin than at least one other LED chip 84).

Figure 8:
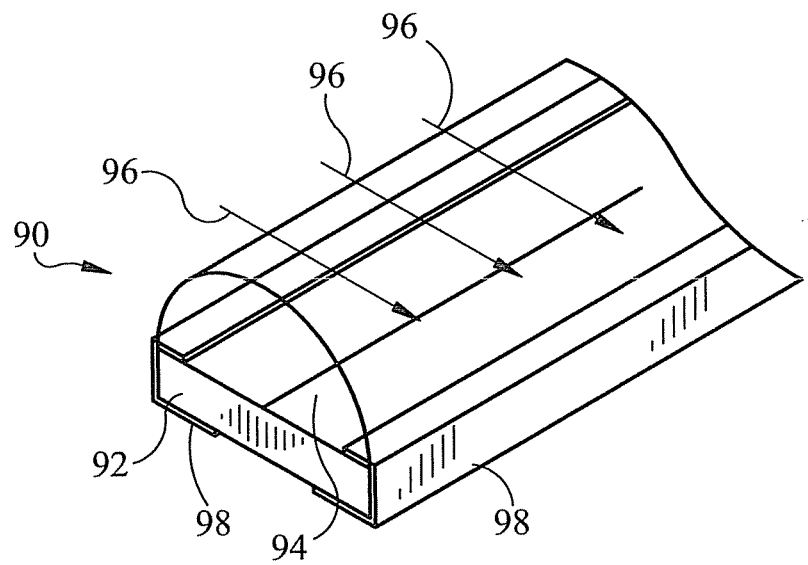
FIG. 8 is a top perspective view illustrating a plurality of submount based light emitter components according to the disclosure herein.

FIG. 8 schematically illustrates another embodiment of a submount based light emitter component, or a plurality of components, generally designated 90 according to the disclosure herein. Components 90 can comprise a panel 92 or strip (e.g., similar to panels $P_I$, $P_{II}$, and $P_{III}$ in FIGS. 1A to 1C) having vias and light emitter chips (not shown) which can be provided below an optical element 94. In some aspects, optical element 94 can comprise a bead or other area of encapsulant that has been dispensed, in liquid form, over panel 92 or strip. Optical element 94 can subsequently harden over submount 92. As discussed above, optical element 94 can advantageously have a low profile dome, which in part allows it to adhere to edges of panel 92 via surface tension. In some aspects, a meniscus forming feature (FIG. 2) could be disposed along opposing edges of panel 92 to confine liquid dispensed encapsulant material to the edges thereof.

In some aspects, component 90 can comprise one or more "wrap around" traces 98 which can extend about three adjacent surfaces of submount, and which can be applied before or after encapsulation. In some aspects, traces 98 can be plated, physically deposited, sputtered, screen printed, sprayed, and/or otherwise applied. In other aspects, traces 98 can comprise a portion of a leadframe or other thin metallic body which has been wrapped about portions of panel 92.

Components 90 can be easily produced as the time consuming process and additional cost associated individually molding optical elements becomes obsolete. Components 90 can be singulated into a plurality of individual submount based components by dicing, cutting, sawing, or otherwise separating components 90 along singulation lines 96 after curing or after hardening of optical element 94. In some aspects, components 90 can be diced in the directions indicated by arrows 96, which can be substantially orthogonal to a longitudinal axis of panel 92.

FIG. 9 illustrates another embodiment of a submount based light emitter component, generally designated 100. Component 100 can comprise a submount 102 that can be singulated from a larger panel of non-metallic or ceramic material (e.g., FIGS. 1A to 1C) after formation of vias and/or after mounting of a light emitter chip, such as a LED chip 104. Notably, panel can be singulated such that upon singulation, vias become exposed, forming multi-sided and external electrical contacts 108. LED chip 104 can be electrically connected to portions of the exposed vias or electrical contacts 108 via wirebonds 106. In some aspects, the panel can be sawn such that vias can be apportioned between two or more submounts, similar to singulation along the broken lines illustrated in FIG. 1C. In some aspects, conductive traces or contact pads 109 can be deposited or applied over and/or about portions of electrical contacts 108.

Notably, electrical contacts 108 can be completely external to submount 102 and disposed along two or more exterior surfaces of submount 102. That is, electrical contacts 108 can be disposed over, along, and/or cover portions of two or more external surfaces of submount 102. For example, electrical contacts 108 can be disposed along portions of a top surface, a bottom surface, and a lateral side surface of submount 102. This can advantageously improve time and cost associated with processing components descried herein by foregoing the need to mold electrical contacts within submount and/or electroplate contacts over vias.

In some aspects, electrical contacts 108 can comprise an exposed thru-hole or via, and can comprise an area of exposed metal, such as Ag. The metal can be exposed by sawing, dicing, etching, cutting, breaking, or otherwise separating and exposing the metal inside the via, such that the metal is on an outer surface of submount 102. In some aspects, a large panel of ceramic material can be provided (e.g., $P_{III}$ FIG. 1C) and one or more vias (e.g., V, FIG. 1C) can be provided therein. The vias can be sawn or cut through such that they are exposed along an outer surface of submount 102 when individual submounts are singulated from the large panel. In some aspects, electrical contacts 108 can comprise areas of Ag, which have been exposed during singulation of submount 102. For example, a large, non-metallic panel can be provided. A plurality of metal filled vias can be provided in the panel. During singulation of individual submounts 102, the panel can be cut or sawn such that vias become cut into and/or otherwise exposed, such that the exposed vias form one or more external electrical contacts 108. LED chips 104 can then be electrically connected thereto, and an optional optical element can be dispensed over LED chip 104 and top surface of submount 102.

Figure 10:
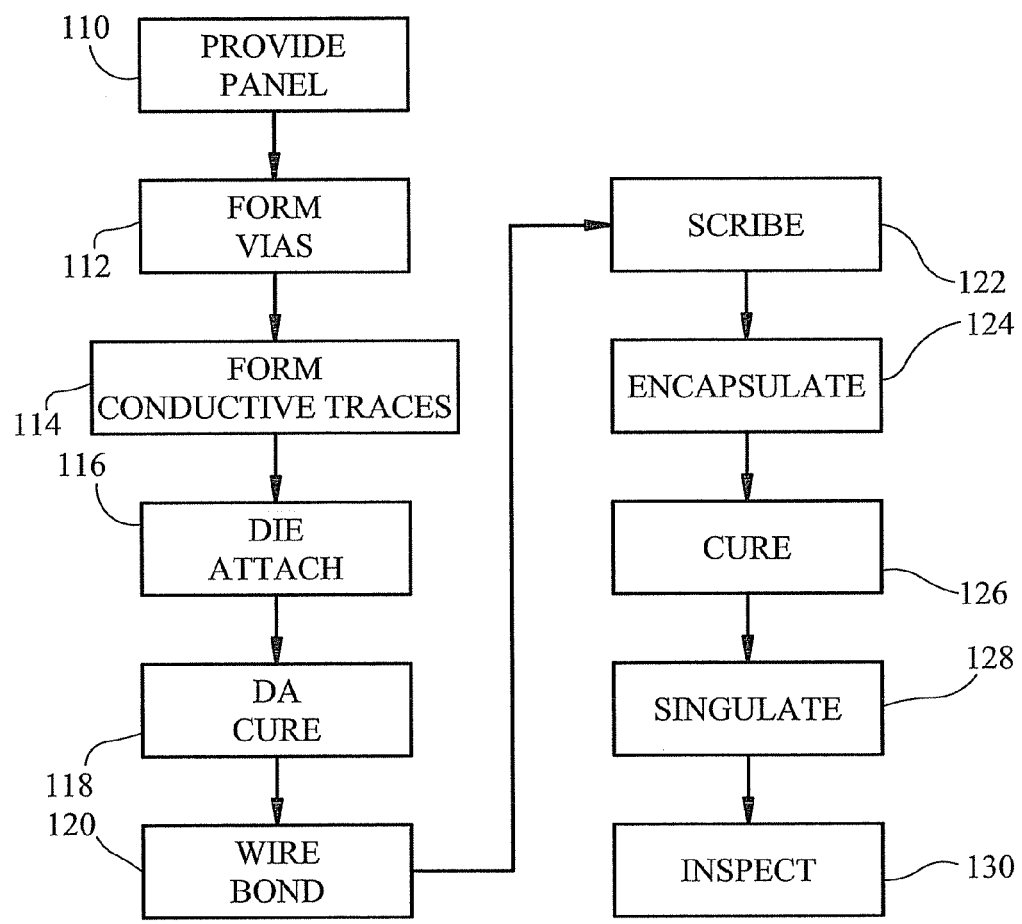
FIG. 10 is a flow chart illustrating exemplary steps for providing a submount based light emitter component according to the disclosure herein.

FIG. 10 is a flow chart illustrating exemplary steps that can be utilized for providing a submount based light emitter component according to the disclosure herein. Step 110 comprises providing a panel. As described herein, the panel can comprise a non-metallic submount material(s) that is/are substantially reflective and substantially non-absorbing of light emitted by one or more LED chips. In some aspects, submount can comprise a ceramic, such as aluminum nitride (AlN) or alumina ($Al_2O_3$). In some aspects, a panel that is approximately 2 inches (")×4" can be provided such that approximately 420 submounts of approximately 3 mm×3 mm can be formed or singulated therefrom.

In step 112, vias can be formed in the panel. In some aspects, a plurality of vias can be etched, drilled, scribed, punched, formed in a green ceramic tape, or otherwise formed such that the vias penetrate internally and extend within a portion of the panel. In some aspects, vias can be formed by laser drilling an already fired HTCC panel. In step 114, conductive traces or electrical contacts can be formed over and/or proximate portions of the vias. Conductive traces or contacts can be applied via any suitable technique as previously described herein, including electroplating, physical deposition, sputtering, screen-printing, etc.

In step 116, a plurality of light emitter chips, such as LED chips, can be provided over the 2"×4" panel and die attached thereto. Light emitter chips can comprise any size, shape, build, structure, and/or color. In some aspects, a plurality of light emitter chips can be provided in an array over the panel. In some aspects, at least one LED chip can be provided between at least two formed vias. In some aspects, each LED chip can be directly attached to the panel via a bonding material such as one comprising epoxy, silicone, solder, flux, paste, etc., or combinations thereof. In step 118, the panel comprising direct attached (DA) light emitter chips can be cured to harden the bonding material. In some aspects, steps 116 and 118 can be repeated for die attaching and curing bonding material between the panel and optional ESD chips. In step 120, the light emitter chips and ESD chips can be wirebonded to traces such as deposited electrical contacts or exposed metallic vias. In some aspects, wirebonds can comprise a positive loop which curves upwardly between components. In other aspects, wirebonds can comprise a negative loop which curves at least partially downwards between components.

In step 122, the panel can be optionally scribed. Scribe lines can be used to mark lines for future singulation of the panel into individual submount based packages. In other aspects, scribe lines can pre-stress the panel before the panel is singulated (e.g., prior to dicing, sawing, shearing, breaking, etc.). In some aspects scribing allows singulation to become easier as the material has been pre-stressed. In some aspects, scribe lines can allow for more uniform edges during singulation. Of note, scribing can be optional and/or can be moved to an earlier step in the process where desired.

In step 124 the panel can be encapsulated. In some aspects, an encapsulant material, such as silicone or epoxy and one or more phosphors can optionally be provided over the panel. The encapsulant can be bound or confined to the top outermost edges of the panel by a meniscus forming feature (e.g., M, FIG. 2), scribe lines, or by surface tension. Notably, in some instances the encapsulant can be applied prior to singulation of the panel into individual components which can be more cost effective. In other aspects, it is contemplated that the panel can be singulated into individual submount based components first, and each component can be individually encapsulated afterwards. This may obviate the need for scribing; hence, previously described scribing step is optional. In step 126, the encapsulant can be cured.

In step 128, the panel can be singulated into individual submount based components, for example, by sawing, cutting, shearing, dicing, or breaking along the scribe lines, such as in a direction indicated in FIG. 8. In some aspects, the panel can be singulated along lines substantially orthogonal to a longitudinal axis or centerline of the panel. In step 130, the submount based components can be inspected prior to distribution to customers.

In some aspects, components and methods provided herein can be configured to deliver more than approximately 160 lumens per Watt (LPW) at a power density of 0.3 W/mm$^2$. In other aspects, components and methods provided herein can be configured to deliver approximately 165 LPW or more, approximately 170 LPW or more, approximately 175 LPW or more, or more than 180 LPW at a power density of 0.3 W/mm$^2$.

Embodiments as disclosed herein may provide one or more of the following beneficial technical effects: reduced cost of providing light emitter components; reduced processing time; reduced size or profile of light emitter components; improved manufacturability of light emitter components; improved ability to vary component features, such as trace design, number of LED chips, and size/shape of optical element.

While the components and methods have been described herein in reference to specific aspects, features, and illustrative embodiments, it will be appreciated that the utility of the subject matter is not thus limited, but rather extends to and encompasses numerous other variations, modifications and alternative embodiments, as will suggest themselves to those of ordinary skill in the field of the present subject matter, based on the disclosure herein. Various combinations and sub-combinations of the structures and features described herein are contemplated and will be apparent to a skilled person having knowledge of this disclosure. Any of the various features and elements as disclosed herein may be combined with one or more other disclosed features and elements unless indicated to the contrary herein. Correspondingly, the subject matter as hereinafter claimed is intended to be broadly construed and interpreted, as including all such variations, modifications and alternative embodiments, within its scope and including equivalents of the claims.

What is claimed is:

1. A light emitter component comprising:
   a submount comprising a first side having a planar surface area;
   at least first and second electrical contacts disposed on the first side of the submount, wherein a combined surface area of the at least first and second electrical contacts comprises an electrical contact area;
   at least one light emitter chip disposed on the first side of the submount and electrically connected to each of the at least first and second electrical contacts, wherein the at least first and second electrical contacts are disposed on one side of the at least one light emitter chip; and
   an optical element disposed over the at least one light emitter chip, wherein the optical element comprises a first portion that is at an acute angle with respect to the planar surface area of the submount and wherein the at least first and second electrical contacts are positioned below the first portion of the optical element;
   wherein the electrical contact area is less than half of the planar surface area of the first side of the submount; and
   wherein the submount comprises a central axis that divides the submount into a first sectional portion and a second sectional portion, the electrical contact area being fully disposed on either the first sectional portion or the second sectional portion.

2. The component of claim 1, wherein the submount comprises a ceramic material.

3. The component of claim 1, wherein the at least first and second electrical contacts are different sizes and different shapes.

4. The component of claim 1, further comprising at least two vias disposed in a portion of the submount.

5. The component of claim 3, further comprising an electrostatic discharge (ESD) protection device disposed over a surface of the first or the second electrical contact.

6. The component of claim 1, wherein the optical element extends to each edge of the first side of the submount.

7. The component of claim 6, wherein the optical element comprises silicone.

8. The component of claim 6, wherein the optical element comprises a phosphor material.

9. The component of claim 6, wherein the optical element comprises a dome.

10. The component of claim 9, wherein a ratio between a dome height and a dome width is less than approximately 0.5.

11. The component of claim 9, wherein a ratio between a submount thickness and the dome height is approximately 1.

12. The component of claim 1, wherein the optical element comprises an encapsulant, at least a portion of the encapsulant being disposed on the first side of the submount.

13. The component of claim 1, wherein the optical element comprises a substantially curved apex.

14. The component of claim 1, wherein the planar surface area comprises approximately 9 square millimeters (mm$^2$) or less.

15. The component of claim 1, wherein the electrical contact area is less than approximately 4.5 mm$^2$.

16. The component of claim 1, wherein the electrical contact area is less than approximately 3.6 mm$^2$.

17. The component of claim 1, wherein the electrical contact area is less than approximately 2.7 mm$^2$.

18. The component of claim 1, wherein the light emitter component is devoid of a cavity.

19. The component of claim 1, further comprising a meniscus forming feature disposed proximate an edge of the submount.

20. The component of claim 1, wherein the submount is a highly reflective alumina submount, to which the at least one light emitter chip is directly mounted.

21. The component of claim 1, further comprising a low profile dome disposed over the submount.

22. The component of claim 1, wherein the submount has a thermal conductivity of greater than 5 Watts per meter-Kelvin (W/mK), greater than 10 W/mK, greater than 50 W/mK, greater than 100 W/mK, greater than 150 W/mK, or greater than 200 W/mK.

23. The component of claim 1, wherein the submount has a thermal conductivity of approximately 20 W/mK.

24. The component of claim 1, wherein the submount has a thermal conductivity of approximately 170 W/mK.

25. The component of claim 1, wherein the at least first and second electrical contacts are positioned away from the at least one light emitter chip by at least approximately 100 micrometers (μm) or more.

26. A light emitter component comprising:
a ceramic based submount comprising a first surface and having a first thickness, a maximum submount width, and a maximum submount length that is substantially equal to the maximum submount width;
at least one light emitter chip disposed on the first surface of the submount; and
an optical element disposed over the submount, the optical element having a second thickness and comprising a low profile lens in a shape of a non-hemispheric dome having a maximum lens width and a maximum lens length that is substantially equal to the maximum lens width, wherein:
a base of the dome contacts the submount at each outermost edge of the submount,
the base of the dome is non-circular,
the maximum lens length and maximum lens width, as measured at the base of the dome, are substantially equal to the maximum submount length and maximum submount width, respectively, and
the second thickness is a maximum height of the dome, as measured from the first surface of the submount,
wherein a ratio between the first thickness and the second thickness is approximately equal to 1, and
wherein a ratio between the maximum lens height and the maximum lens width of the dome is less than 0.5.

27. The component of claim 26, further comprising first and second electrical contacts disposed on the submount, wherein the first and second electrical contacts comprise a different size and a different shape.

28. The component of claim 26, further comprising a first electrical contact and a second electrical contact that are disposed along a same edge of the submount and on a same side of the at least one light emitter chip.

29. The component of claim 26, further comprising at least two vias disposed in a portion of the submount.

30. The component of claim 26, wherein the submount comprises alumina.

31. The component of claim 26, wherein the optical element extends to each outermost edge of the submount.

32. The component of claim 26, further comprising an electrostatic discharge (ESD) protection device disposed on the first surface of the submount.

33. The component of claim 29, wherein a portion of each of the at least two vias is disposed along an external surface of the submount.

34. The component of claim 26, wherein the optical element comprises an encapsulant, at least a portion of the encapsulant being disposed on a same side of the submount to which the at least one light emitter chip is mounted.

35. The component of claim 26, wherein the optical element comprises a sectional profile, a first portion of a sectional profile being substantially curved and a second portion of the sectional profile being substantially straight and acutely angled with respect to the first surface of the submount.

36. The component of claim 26, wherein the submount is a highly reflective alumina submount, to which the at least one light emitter chip is directly mounted.

37. The component of claim 26, further comprising a plurality of light emitter chips on the submount.

38. The component of claim 26, wherein the submount has a thermal conductivity of greater than 5 W/mK, greater than 10 W/mK, greater than 50 W/mK, greater than 100 W/mK, greater than 150 W/mK, or greater than 200 W/mK.

39. The component of claim 26, wherein the submount has a thermal conductivity of approximately 20 W/mK.

40. The component of claim 26, wherein the submount has a thermal conductivity of approximately 170 W/mK.

41. The component of claim 26, further comprising first and second electrical contacts disposed on the submount, wherein the first and second electrical contacts are positioned away from the at least one light emitter chip by at least approximately 100 μm or more.

42. A light emitter component comprising:
a submount comprising a first surface and having a maximum submount width and a maximum submount length that is substantially equal to the maximum submount width;
at least one light emitter chip disposed on the first surface of the submount; and
a lens having an apex and a maximum lens height, as measured from the first surface of the submount, the lens comprising a non-circular lens base, which has a base width,
wherein the base width of the non-circular lens base is substantially equal to the maximum submount length and the maximum submount width,
wherein the apex is centrally disposed over the at least one light emitter chip and the lens has a profile without any points of inflection from the apex to an outer edge of the submount, and
wherein a ratio between the maximum lens height and the base width is less than 0.5.

43. The component of claim 42, wherein the ratio of the maximum lens height and the base width is less than approximately 0.4.

44. The component of claim 42, wherein the ratio of the maximum lens height and the base width is less than approximately 0.3.

45. The component of claim 42, wherein the ratio of the maximum lens height and the base width is less than approximately 0.2.

46. The component of claim 42, wherein the lens comprises silicone.

47. The component of claim 42, wherein the submount comprises a ceramic material.

48. The component of claim 42, wherein the submount is a highly reflective alumina submount, to which the at least one light emitter chip is directly mounted.

49. The component of claim 42, further comprising a plurality of light emitter chips on the submount.

50. The component of claim 42, wherein the lens comprises an encapsulant, at least a portion of the encapsulant being disposed on a same side of the submount to which the at least one light emitter chip is mounted.

51. The component of claim 42, wherein the profile of the lens comprises a first portion that is substantially curved and a second portion that is substantially straight.

52. The component of claim 42, wherein the at least one light emitter chip comprises at least one light emitting diode (LED).

53. The component of claim 42, further comprising a via.

54. The component of claim 53, wherein the via is at least partially disposed along an external surface of the submount.

55. The component of claim 53, wherein the via is only disposed internally within a portion of the submount.

56. The component of claim 42, wherein the submount has a thermal conductivity of greater than 5 W/mK, greater than 10 W/mK, greater than 50 W/mK, greater than 100 W/mK, greater than 150 W/mK, or greater than 200 W/mK.

57. The component of claim 42, wherein the submount has a thermal conductivity of approximately 20 W/mK.

58. The component of claim 42, wherein the submount has a thermal conductivity of approximately 170 W/mK.

59. The component of claim 42, further comprising first and second electrical contacts disposed on the submount, wherein the first and second electrical contacts are positioned away from the at least one light emitter chip by at least approximately 100 μm or more.

* * * * *